US007021369B2

(12) United States Patent
Werner et al.

(10) Patent No.: US 7,021,369 B2
(45) Date of Patent: Apr. 4, 2006

(54) HERMETIC CLOSED LOOP FLUID SYSTEM

(75) Inventors: Douglas Werner, Atherton, CA (US); Mark Munch, Los Altos, CA (US); Thomas Kenny, San Carlos, CA (US)

(73) Assignee: Cooligy, Inc., Mountain View, CA (US)

( * ) Notice: Subject to any disclaimer, the term of this patent is extended or adjusted under 35 U.S.C. 154(b) by 29 days.

(21) Appl. No.: 10/769,717

(22) Filed: Jan. 29, 2004

(65) Prior Publication Data

US 2005/0016715 A1 Jan. 27, 2005

Related U.S. Application Data

(60) Provisional application No. 60/489,730, filed on Jul. 23, 2003.

(51) Int. Cl.
*F28D 15/00* (2006.01)

(52) U.S. Cl. ................................ 165/104.33; 165/80.4

(58) Field of Classification Search ........... 165/104.33, 165/104.22, 104.28, 80.4, 80.5; 257/714, 257/715; 361/699, 700
See application file for complete search history.

(56) References Cited

U.S. PATENT DOCUMENTS

| | | | |
|---|---|---|---|
| 0,596,062 | A | 12/1897 | Firey |
| 2,273,505 | A | 2/1942 | Florian |
| 3,654,988 | A | 4/1972 | Clayton, III |
| 3,817,321 | A | 6/1974 | von Cube et al. |
| 3,823,572 | A | 7/1974 | Cochran, Jr. |
| 3,923,426 | A | 12/1975 | Theeuwes |
| 3,929,154 | A | 12/1975 | Goodwin |
| 4,109,707 | A | 8/1978 | Wilson et al. |
| 4,194,559 | A | 3/1980 | Eastman |
| 4,211,208 | A | 7/1980 | Lindner |
| 4,248,295 | A | 2/1981 | Ernst et al. |

(Continued)

FOREIGN PATENT DOCUMENTS

| | | |
|---|---|---|
| CN | 97212126.9 | 3/1997 |

(Continued)

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059-2063.

(Continued)

*Primary Examiner*—Teresa J. Walberg
(74) *Attorney, Agent, or Firm*—Haverstock & Owens LLP

(57) ABSTRACT

A hermetic closed loop fluid system for controlling temperature of a heat source includes at least one component including at least one heat exchanger in contact with the heat source. The heat exchanger is configured to pass a fluid therethrough, wherein the fluid performs thermal exchange with the heat source. A predetermined amount of the fluid remains within the fluid system for a desired amount of operating time. The desired amount of operating time is preferably at least 10 years. Alternatively, the desired amount of operating time is at least 3 years. The predetermined amount of fluid is preferably ninety percent of an initial amount of fluid. Alternatively, the predetermined amount of fluid is seventy five percent of an initial amount of fluid. Still alternatively, at least fifty percent of the fluid can remain within the fluid system for the desired amount of operating time. The fluid can be a single phase fluid. The fluid can also be a two phase fluid.

66 Claims, 7 Drawing Sheets

U.S. PATENT DOCUMENTS

| | | | | |
|---|---|---|---|---|
| 4,485,429 | A | 11/1984 | Mittal | |
| 4,561,040 | A | 12/1985 | Eastman et al. | |
| 4,664,181 | A | 5/1987 | Sumberg | |
| 4,866,570 | A | 9/1989 | Porter | |
| 4,894,709 | A | 1/1990 | Phillips et al. | |
| 4,896,719 | A | 1/1990 | O'Neill et al. | |
| 4,908,112 | A | 3/1990 | Pace | |
| 5,009,760 | A | 4/1991 | Zare et al. | |
| 5,043,797 | A * | 8/1991 | Lopes | 257/714 |
| 5,058,627 | A | 10/1991 | Brannen | |
| 5,070,040 | A | 12/1991 | Pankove | |
| 5,088,005 | A | 2/1992 | Ciaccio | |
| 5,096,388 | A | 3/1992 | Weinberg | |
| 5,099,311 | A | 3/1992 | Bonde et al. | |
| 5,099,910 | A | 3/1992 | Walpole et al. | |
| 5,125,451 | A | 6/1992 | Matthews | |
| 5,131,233 | A | 7/1992 | Cray et al. | |
| 5,203,401 | A | 4/1993 | Hamburgen et al. | |
| 5,218,515 | A | 6/1993 | Bernhardt | |
| 5,219,278 | A | 6/1993 | van Lintel | |
| 5,232,047 | A | 8/1993 | Matthews | |
| 5,239,200 | A | 8/1993 | Messina et al. | |
| 5,263,251 | A | 11/1993 | Matthews | |
| 5,274,920 | A | 1/1994 | Matthews | |
| 5,309,319 | A | 5/1994 | Messina | |
| 5,317,805 | A | 6/1994 | Hoopman et al. | |
| 5,325,265 | A | 6/1994 | Turlik et al. | |
| 5,336,062 | A | 8/1994 | Richter | |
| 5,380,956 | A | 1/1995 | Loo et al. | |
| 5,383,340 | A | 1/1995 | Larson et al. | |
| 5,427,174 | A | 6/1995 | Lomolino, Sr. et al. | |
| 5,436,793 | A | 7/1995 | Sanwo et al. | |
| 5,514,906 | A | 5/1996 | Love et al. | |
| 5,544,696 | A | 8/1996 | Leland | |
| 5,548,605 | A | 8/1996 | Benett et al. | |
| 5,579,828 | A | 12/1996 | Reed et al. | |
| 5,585,069 | A | 12/1996 | Zanzucchi et al. | |
| 5,641,400 | A | 6/1997 | Kaltenbach et al. | |
| 5,692,558 | A | 12/1997 | Hamilton et al. | |
| 5,696,405 | A | 12/1997 | Weld | |
| 5,703,536 | A | 12/1997 | Davis et al. | |
| 5,704,416 | A | 1/1998 | Larson et al. | |
| 5,727,618 | A | 3/1998 | Mundinger et al. | |
| 5,759,014 | A | 6/1998 | Van Lintel | |
| 5,763,951 | A * | 6/1998 | Hamilton et al. | 257/714 |
| 5,800,690 | A | 9/1998 | Chow et al. | |
| 5,801,442 | A | 9/1998 | Hamilton et al. | |
| 5,835,345 | A | 11/1998 | Staskus et al. | |
| 5,836,750 | A | 11/1998 | Cabuz | |
| 5,858,188 | A | 1/1999 | Soane et al. | |
| 5,863,708 | A | 1/1999 | Zanzucchi et al. | |
| 5,869,004 | A | 2/1999 | Parce et al. | |
| 5,870,823 | A | 2/1999 | Bezama et al. | |
| 5,874,795 | A | 2/1999 | Sakamoto | |
| 5,876,655 | A | 3/1999 | Fisher | |
| 5,880,017 | A | 3/1999 | Schwiebert et al. | |
| 5,880,524 | A | 3/1999 | Xie | |
| 5,936,192 | A | 8/1999 | Tauchi | |
| 5,940,270 | A | 8/1999 | Puckett | |
| 5,942,093 | A | 8/1999 | Rakestraw et al. | |
| 5,964,092 | A | 10/1999 | Tozuka et al. | |
| 5,965,001 | A | 10/1999 | Chow et al. | |
| 5,965,813 | A | 10/1999 | Wan et al. | |
| 5,978,220 | A | 11/1999 | Frey et al. | |
| 5,997,713 | A | 12/1999 | Beetz, Jr. et al. | |
| 5,998,240 | A | 12/1999 | Hamilton et al. | |
| 6,007,309 | A | 12/1999 | Hartley | |
| 6,010,316 | A | 1/2000 | Haller et al. | |
| 6,013,164 | A | 1/2000 | Paul et al. | |
| 6,019,882 | A | 2/2000 | Paul et al. | |
| 6,068,752 | A | 5/2000 | Dubrow et al. | |
| 6,090,251 | A | 7/2000 | Sundberg et al. | |
| 6,096,656 | A | 8/2000 | Matzke et al. | |
| 6,100,541 | A | 8/2000 | Nagle et al. | |
| 6,101,715 | A | 8/2000 | Fuesser et al. | |
| 6,119,729 | A | 9/2000 | Oberholzer et al. | |
| 6,126,723 | A | 10/2000 | Drost | |
| 6,129,145 | A | 10/2000 | Yamamoto et al. | |
| 6,131,650 | A | 10/2000 | North et al. | |
| 6,146,103 | A | 11/2000 | Lee et al. | |
| 6,154,363 | A | 11/2000 | Chang | |
| 6,159,353 | A | 12/2000 | West et al. | |
| 6,171,067 | B1 | 1/2001 | Parce | |
| 6,174,675 | B1 | 1/2001 | Chow et al. | |
| 6,176,962 | B1 | 1/2001 | Soane et al. | |
| 6,186,660 | B1 | 2/2001 | Kopf-Sill et al. | |
| 6,210,986 | B1 | 4/2001 | Arnold et al. | |
| 6,216,343 | B1 | 4/2001 | Leland et al. | |
| 6,221,226 | B1 | 4/2001 | Kopf-Sill | |
| 6,227,809 | B1 | 5/2001 | Forster et al. | |
| 6,277,257 | B1 | 8/2001 | Paul et al. | |
| 6,287,440 | B1 | 9/2001 | Arnold et al. | |
| 6,301,109 | B1 | 10/2001 | Chu et al. | |
| 6,313,992 | B1 | 11/2001 | Hildebrandt | |
| 6,317,326 | B1 | 11/2001 | Vogel et al. | |
| 6,321,791 | B1 | 11/2001 | Chow | |
| 6,322,753 | B1 | 11/2001 | Lindberg et al. | |
| 6,324,058 | B1 | 11/2001 | Hsiao | |
| 6,337,794 | B1 | 1/2002 | Agonafer et al. | |
| 6,351,384 | B1 * | 2/2002 | Daikoku et al. | 361/704 |
| 6,388,317 | B1 | 5/2002 | Reese | |
| 6,397,932 | B1 | 6/2002 | Calaman et al. | |
| 6,400,012 | B1 | 6/2002 | Miller et al. | |
| 6,406,605 | B1 | 6/2002 | Moles | |
| 6,415,860 | B1 | 7/2002 | Kelly et al. | |
| 6,416,642 | B1 | 7/2002 | Alajoki et al. | |
| 6,417,060 | B1 | 7/2002 | Tavkhelidze et al. | |
| 6,424,531 | B1 | 7/2002 | Bhatti et al. | |
| 6,438,984 | B1 | 8/2002 | Novotny et al. | |
| 6,443,222 | B1 | 9/2002 | Yun et al. | |
| 6,444,461 | B1 | 9/2002 | Knapp et al. | |
| 6,457,515 | B1 | 10/2002 | Vafai et al. | |
| 6,495,015 | B1 | 12/2002 | Schoeniger et al. | |
| 6,537,437 | B1 | 3/2003 | Galambos et al. | |
| 6,543,521 | B1 | 4/2003 | Sato et al. | |
| 6,553,253 | B1 | 4/2003 | Chang | |
| 6,572,749 | B1 | 6/2003 | Paul et al. | |
| 6,581,388 | B1 | 6/2003 | Novotny et al. | |
| 6,587,343 | B1 | 7/2003 | Novotny et al. | |
| 6,588,498 | B1 | 7/2003 | Reysin et al. | |
| 6,591,625 | B1 | 7/2003 | Simon | |
| 6,632,655 | B1 | 10/2003 | Mehta et al. | |
| 2001/0016985 | A1 | 8/2001 | Insley et al. | |
| 2001/0024820 | A1 | 9/2001 | Mastromatteo et al. | |
| 2001/0044155 | A1 | 11/2001 | Paul et al. | |
| 2001/0045270 | A1 | 11/2001 | Bhatti et al. | |
| 2001/0046703 | A1 | 11/2001 | Burns et al. | |
| 2001/0055714 | A1 | 12/2001 | Cettour-Rose et al. | |
| 2002/0011330 | A1 | 1/2002 | Insley et al. | |
| 2002/0075645 | A1 | 6/2002 | Kitano et al. | |
| 2002/0121105 | A1 | 9/2002 | McCarthy, Jr. et al. | |
| 2003/0121274 | A1 | 7/2003 | Wightman | |
| 2004/0040695 | A1 | 3/2004 | Chesser et al. | |
| 2004/0052049 | A1 * | 3/2004 | Wu et al. | 361/699 |
| 2004/0070935 | A1 * | 4/2004 | Tomioka et al. | 361/687 |
| 2004/0089008 | A1 | 5/2004 | Tilton et al. | |
| 2004/0125561 | A1 * | 7/2004 | Gwin et al. | 361/699 |
| 2004/0160741 | A1 * | 8/2004 | Moss et al. | 361/699 |
| 2004/0188069 | A1 * | 9/2004 | Tomioka et al. | 165/104.33 |

FOREIGN PATENT DOCUMENTS

| | | |
|---|---|---|
| JP | 10-99592 | 4/1998 |
| JP | 2000-277540 | 10/2000 |
| JP | 2001-326311 | 11/2001 |

OTHER PUBLICATIONS

Kendra V. Sharp et al., "Liquid Flows in Microchannels", 2002, vol. 6, pp. 6-1 to 6-38.
Shuchi Shoji et al., "Microflow devices and systems", J. Microcech. Microeng. 4 (1994), pp. 157-171, printed in the U.K.
Angela Rasmussen et al., "Fabrication Techniques to Realize CMOS-Compatible Microfluidic Microchannels", Journal of Microelectromechanical, Vo. 10, No. 2, Jun. 2001, pp. 286-297.
J. H. Wang et al., "Thermal-Hydraulic Characteristic of Micro Heat Exchangers", 1991, DSC-vol. 32, Micromechanical Sensors, Actuators, and Systems, pp. 331-339.
Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.
X. F. Peng et al., "Heat Transfer Characteristics of Water Flowing through Microchannels", Experimental Heat Transfer An International Journal, vol. 7, No. 4; Oct.-Dec. 1994, pp. 265-283.
Linan Jiang et al., "Forced Convection Boiling in a Microchannel Heat Sink", Journal of Microelectromechanical Systems, vol. 10, No. 1, Mar. 2001, pp. 80-87.
Muhammad M. Rahman et al., "Experimental Measurements of Fluid Flow and Heat Transfer in Microchannel Cooling Passages in a Chip Substrate", 1993, EEP-vol. 4-2, Advances in Electronic Packages, pp. 685-692.
X. F. Peng et al., "Forced convection and flow boiling heat transfer for liquid flowing through Microchannels", 1993, Int. J. Heat Mass Transfer, vol. 36, No. 14, pp. 3421-3427.
Lung-Jieh Yang et al., "A Micro Fluidic System of Micro Channels with On-Site Sensors by Silicon Bulk Micromaching", Sep. 1999, Microfluidic Devices and Systems II, vol. 3877, pp. 267-272.
G. Mohiuddin Mala et al., "Heat transfer and fluid flow in microchannels", 1997, Int. J. Mass transfer, vol. 40, No. 13, pp. 3079-3088, printed in Great Britain.
J. M. Cuta et al., "Fabrication and Testing of Micro-Channel Heat Exchangers", SPIE Microlithography and Metrology in Micromaching, vol. 2640, 1995, pp. 152-160.
Linan Jiang et al., "A Micro-Channel Heat Sink with Integrated Temperature Sensors for Phase Transition Study", 1999, 12$^{th}$ IEEE International Conference on Micro Electro Mechanical Systems, pp. 159-164.
Linan Jiang et al., "Fabrication and characterization of a microsystem for a micro-scale heat transfer study", J. Micromech. Microeng. 9 (1999) pp. 422-428, printed in the U.K.
M. B. Bowers et al., "High flux boiling in low flow rate, low pressure drop mini-channel and micro-channel heat sinks", 1994, Int. J. Heat Mass Transfer, vol. 37, No. 2, pp. 321-332.
Yongendra Joshi, "Heat out of small packages", Dec. 2001, Mechanical Engineer, pp. 56-58.
A. Rostami et al., "Liquid Flow and Heat Transfer in Microchannels: a Review", 2000, Heat and Technology, vol. 18, No. 2, pp. 59-68.
Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.
Muhammad Mustafizur Rahman, "Measurements of Heat Transfer in Microchannel Heat Sinks", Int. Comm. Heat Mass Transfer, vol. 27, No. 4, May 2000, pp. 495-506.
Issam Mudawar et al., "Enhancement of Critical Heat Flux from High Power Microelectronic Heat Sources in a Flow Channel", Journal of Electronic Packaging, Sep. 1990, vol. 112, pp. 241-248.
Nelson Kuan, "Experimental Evaluation of Micro Heat Exchangers Fabricated in Silicon", 1996, HTD-vol. 331, National Heat Transfer Conference, vol. 9, pp. 131-136.
E. W. Kreutz et al., "Simulation of micro-channel heat sinks for optoelectronic microsystems", Microelectronics Journal 31(2000) pp. 787-790.
J. C. Y. Koh et al., "Heat Transfer of Microstructure for Integrated Circuits", 1986, Int. Comm. Heat Mass Transfer, vol. 13, pp. 89-98.
Snezana Konecni et al., "Convection Cooling of Microelectronic Chips", 1992, InterSociety Conference on Thermal Phenomena, pp. 138-144.
Michael B. Kleiner et al., "High Performance Forced Air Cooling Scheme Employing Microchannel Heat Exchangers", 1995, IEEE Transactions on Components, Packaging, and Manufacturing Technology-Part A, vol. 18, No. 4, pp. 795-804.
Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.
Shung-Wen Kang et al., "The Performance Test and Analysis of Silicon-Based Microchannel Heat Sink", Jul. 1999, Terahertz and Gigahertz Photonics, vol. 3795, pp. 259-270.
Joseph C. Tramontana, "Semiconductor Laser Body Heat Sink", Xerox Disclosure Journal, vol. 10, No. 6, Nov./Dec. 1985, pp. 379-381.
Sarah Arulanandam et al., "Liquid transport in rectangular microchannels by electroosmotic pumping", Colloid and Surfaces A: Physicochemical and Engineering Aspects 161 (2000), pp. 89-102.
Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.
"Autonomous displacement of a solution in a microchannel by another solution", Research Disclosure, Jun. 2001, pp. 1046-1047.
John M. Waldvogel, "Aluminum Silicon Carbide Phase Change Heat Spreader", Motorola, Jun. 1999, Technical Developments, pp. 226-230.
James P. Slupe et al., "An idea for maintaining a stable thermal environment for electronic devices", Research Disclosure, Aug. 2001, p. 1312.
John M. Waldvogel, "A Heat Transfer Enhancement Method for Forced Convection Bonded-Fin Heatsinks", Motorola, Dec. 1997, Technical Developments, pp. 158-159.
"Thin Heat Pipe for Cooling Components on Printed Circuit Boards", IBM Technical Disclosure Bulletin, vol. 34, No. 7B, Dec. 1991, pp. 321-322.
R. C. Chu et al., "Process for Nucleate Boiling Enhancement", IBM Technical Disclosure Bulletin, vol. 18, No. 7, Dec. 1975, p. 2227.
J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.
"Enhanced Cooling of Thermal Conduction Module", IBM Technical Disclosure Bulletin, vol. 30, No. 5, Oct. 1987, p. 426.
"Heat Exchanger Modules for Data Process with Valves Operated by Pressure form Cooling Water Pump", IBM Technical Disclosure Bulletin, vol. 30, No. 5, Oct. 1987, p. 419.
"Cold Plate for Thermal Conduction Module with Inlet for Cooling Water Near Highest Power Chips", IBM Technical Disclosure Bulletin, vol. 30, No. 5, Oct. 1987, p. 413.
"Circuit Module Cooling with Coaxial Bellow Providing Inlet, Outlet and Redundant Connections to Water-Cooled Element", IBM Technical Bulletin, vol. 30, No. 5, Oct. 1987, pp. 345-347.
"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.
"Cooling System for Chip Carrier on Card", IBM Technical Disclosure Bulletin, vol. 31, No. 4, Sep. 1988, pp. 39-40.
"Chip Cooling Device", IBM Technical Disclosure Bulletin, vol. 30, No. 9, Feb. 1988, pp. 435-436.
W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.
N. P. Bailey et al., "Cooling Device for Controlled Rectifier", IBM Technical Disclosure Bulletin, vol. 21, No. 11, Apr. 1979, pp. 4609-4610.
W. J. Kleinfelder et al., "Liquid-Filled Bellows Heat Sink", IBM Technical Disclosure Bulletin, vol. 21, No. 10, Mar. 1979, pp. 4125-4126.
R. P. Chrisfield et al., "Distributed Power/Thermal Control", IBM Technical Disclosure Bulletin, vol. 22, No. 3, Aug. 1979, pp. 1131-1132.
A. J. Arnold et al., "Heat Sink Design for Cooling Modules in a Forced Air Environment", IBM Technical Disclosure Bulletin, vol. 22, No. 6, Nov. 1979, pp. 2297-2298.
A. J. Arnold, "Structure for the Removal of Heat from an Integrated Circuit Module", IBM Technical Disclosure Bulletin, vol. 22, No. 6, Nov. 1979, pp. 2294-2296.
U. P. Hwang et al., "Cold Plate For Thermal Conduction Module with Improved Flow Pattern and Flexible Base", IBM Technical Disclosure Bulletin, vol. 25, No. 9, Feb. 1983, p. 4517.
K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.
R. C. Chu et al., "Silicon Heat Sink for Semiconductor Chip", IBM Technical Disclosure Bulletin, vol. 24, No. 11A, Apr. 1982, p. 5743.
J. M. Eldridge et al., "Heat-Pipe Vapor Cooling Etched Silicon Structure", IBM Technical Disclosure Bulletin, vol. 25, No. 8, Jan. 1983, pp. 4118-4119.
J. R. Skobem, "Thermoelectrically Cooled Module", IBM Technical Disclosure Bulletin, vol. 27, No. 1A, Jun. 1984, p. 30.
M. J. Brady et al., "Etched Silicon Integrated Circuit Heat Sink", IBM Technical Disclosure Bulletin, vol. 27, No. 1B, Jun. 1984, p. 627.
H. D. Edmonds et al., "Heat Exchange Element for Semiconductor Device Cooling", IBM Technical Disclosure Bulletin, vol. 23, No. 3, Aug. 1980, p. 1057.
R. W. Noth, "Heat Transfer from Silicon Chips and Wafers", IBM Technical Disclosure Bulletin, vol. 17, No. 12, May 1975, p. 3544.
"Forced Boiling Cooling System with Jet Enhancement for Crititical Heat Flux Extension", IBM Technical Disclosure Bulletin, vol. 39, No. 10, Oct. 1996, p. 143.
"Miniature Heat Exchanger for Corrosive Media", IBM Technical Disclosure Bulletin, vol. 38, No. 1, Jan. 1995, pp. 55-56.
"Self-Contained Active Heat Dissipation Device", IBM Technical Disclosure Bulletin vol. 39, No. 4, Apr. 1996, pp. 115-116.
C. J. Keller et al., "Jet Cooling Cup for Cooling Semiconductor Devices", IBM Technical Disclosure Bulletin, vol. 20, No. 9, Feb. 1978, pp. 3575-3576.
B. J. Ronkese, "Centerless Ceramic Package with Directly Connected Heat Sink", IBM Technical Disclosure Bulletin, vol. 20, No. 9, Feb. 1978, p. 3577-3578.
K. S. Sachar, "Liquid Jet Cooling of Integrated Circuit Chips", vol. 20, No. 9, Feb. 1978, pp. 3727-3728.
A. H. Johnson, "Device Cooling", IBM Technical Disclosure Bulletin, vol. 20, No. 10, Mar. 1978, pp. 3919-3920.
A. L. Pacuzzo et al., "Integrated Circuit Module Package Cooling Structure", IBM Technical Disclosure Bulletin, vol. 20, No. 10, Mar. 1978, pp. 3898-3899.
R. D. Durand et al., "Flexible Thermal Conductor for Electronic Module", IBM Technical Disclosure Bulletin, vol. 20, No. 11A, Apr. 1978, p. 4343.
D. Balderes et al., "Liquid Cooling of a Multichip Module Package", IBM Technical Disclosure Bulletin, vol. 20, No. 11A, Apr. 1978, pp. 4336-4337.
J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.
V. W. Antonetti et al., "Integrated Module Heat Exchanger", IBM Technical Disclosure Bulletin, vol. 20, No. 11A, Apr. 1978, p. 4498.
P. Hwang et al., "Conduction Cooling Module", IBM Technical Disclosure Bulletin, vol. 20, No. 11A, Apr. 1978, pp. 4334-4335.
A. J. Arnold, "Electronic Packaging Structure", IBM Technical Disclosure Bulletin, vol. 20, No. 11B, Apr. 1978, pp. 4820-4822.
V. Y. Doo et al., "High Performance Package for Memory", IBM Technical Disclosure Bulletin, vol. 21, No. 2, Jul. 1978, pp. 585-586.
"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.
J. Landrock et al., "Cooling System for Semiconductor Chips", IBM Technical Disclosure Bulletin, vol. 23, No. 4, Sep. 1980, p. 1483.
E. P. Damm, Jr., "Convection Cooling Apparatus", IBM Technical Disclosure Bulletin, vol. 20, No. 7, Dec. 1977, pp. 2755-2756.
"Circuit Package with Circulating Boiling Liquid and Local Heat Exchanger to Limit Vapor in Coolant Outlet", IBM Technical Disclosure Bulletin, vol. 31, No. 12 May 1989, p. 34.
"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.
"TCM-Like Circuit Module with Local Heat Sink Resting on Chip and Chip Seperated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305-306.
"Water-Cooled Circuit Module with Grooves Forming Water Passages Near Heat-Producing Devices", IBM Technical Disclosure Bulletin, vol. 31, No. 12, May 1989, pp. 49-50.
"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.
"Thermal Control Hardware for Accelerated Run-In Testing of Multi-Chip Modules", IBM Technical Disclosure Bulletin, vol. 32, No. 5A, Oct. 1989, p. 129-130.
"Means of Removing More Heat From a TCM (Or Other Liquid-Cooled Logic Package) By Reducing the Coolant Temperature", IBM Technical Disclosure Bulletin, vol. 32 No. 5A, Oct. 1989, pp. 153-154.
E. G. Loeffel et al., "Liquid Cooled Module with Compliant Membrane", IBM Technical Disclosure Bulletin, vol. 20, No. 2, Jul. 1977, pp. 673-674.
V. Y. Doo et al., "Method of Effective Cooling of a High Power Silicon Chip", IBM Technical Disclosure Bulletin, vol. 20, No. 4, Sep. 1977, p. 1436-1437.
V. Y. Doo et al., Semiconductor Chip Cooling Package, IBM Technical Disclosure Bulletin, vol. 20, No. 4, Sep. 1977, pp. 1440-1441.
"Heat Sink Fabrication Method", IBM Technical Disclosure Bulletin, vol. 27, No. 10A, Mar. 1985, p. 5656-5657.
"Thermal Conduction Module with Liquid Dielectric and Pistons with Surface Treatment for Enhanced Nucleate Boiling", IBM Technical Disclosure Bulletin, vol. 27, No. 12, May 1985, p. 6904.
"Pin Fin Array Heat Pipe Apparatus", IBM Technical Disclosure Bulletin, vol. 37, No. 9, Sep. 1994, p. 171.
Youngcheol Joo et al., "Fabrication of Monolithic Microchannels for IC Chip Cooling", 1995, IEEE Micro Electro Mechanical Systems, pp. 362-367.
Jaisree Moorthy et al., *Active control of electroosmotic flow in microchannels using light*, Jan. 26, 2001, Sensors and Actuators B 75, pp. 223-229.
Andreas Manz et al., *Electroosmotic pumping and electrophoretic separations for miniaturized chemical analysis systems*, Sep. 16, 1994, J. Micromech. Microeng. 4 (1994), pp. 257-265, printed in the U.K.
E. B. Cummings et al., *Irrotationality of uniform electroosmosis*, Sep. 1999, Part of the SPIE Conference on Microfluidic Devices and Systems II, SPIE vol. 3877, pp. 180-189.
Stephen C. Jacobson et al., *Fused Quartz Substrates for Microchip Electrophoresis*, Jul. 1, 1995, Analytical Chemistry, vol. 67, No. 13, pp. 2059-2063.
Haim H. Bau, *Optimization of conduits' shape in micro heat exchangers*, Dec. 10, 1997, International Journal of Heat and Mass Transfer 41 (1998), pp. 2717-2723.
V. K. Dwivedi et al., *Fabrication of very smooth walls and bottoms of silicon microchannels for heat dissipation of semiconductor devices*, Jan. 25, 2000, Microelectronics Journal 31 (2000), pp. 405-410.
M. B. Bowers et al.,, *Two-Phase Electronic Cooling Using Mini-Channel and Micro-Channel Heat Sinks: Part 2-Flow Rate and Pressure Drop Constraints*, Dec. 1994, Journal of Electronic Packaging 116, pp. 298-305.
Meint J. de Boer et al., *Micromachining of Buried Micro Channels in Silicon*, Mar. 2000, Journal of Microelectromechanical systems, vol. 9, No. 1, pp. 94-103.
S.B. Choi et al., *Fluid Flow and Heat Transfer in Microtubes*, 1991, DSC-vol. 32, Micromechanical sensors, Actuators, and Systems, ASME 1991, pp. 123-134.
S. F. Choquette, M. Faghri et al., *Optimum Design of Microchannel Heat Sinks*, 1996, DSC-vol. 59, Microelectromechanical Systems (MEMS), ASME 1996, pp. 115-126.
David Copeland et al., *Manifold Microchannel Heat Sinks: Theory and Experiment*, 1995, EEP-vol. 10-2, Advances in Electronic Packaging ASME 1995, pp. 829-835.
J. M. Cuta et al., *Forced Convection Heat Transfer in Parallel Channel Array Microchannel Heat Exchanger*, 1996, PID-vol. 27 HTD-vol. 338, Advances in Energy efficiency, Heat/Mass Transfer Enhancement, ASME 1996, pp. 17-23.
K. Fushinobu et al., *Heat Generation and Transport in Sub-Micron Semiconductor Devices*, 1993, HTD-vol. 253, Heat Transfer on the Microscale, ASME 1993, pp. 21-28.
Charlotte Gillot et al., *Integrated Micro Heat Sink for Power Multichip Module*, Sep. 3, 1999, IEEE Transactions on Industry Applications, vol. 36. No. 1. Jan./Feb. 2000, pp. 217-221.
John Gooding, *Microchannel heat exchangers—a review*, SPIE vol. 1997 High Heat Flux Engineering II (1993), pp. 66-82.
Koichiro Kawano et al., *Micro Channel Heat Exchanger for Cooling Electrical Equipment*, HTD-vol. 361-3/PID-vol. 3, Proceeding of the ASME Heat Transfer Division—vol. 3, ASME 1998, pp. 173-188.
Chad Harris et al., *Design and Fabrication of a Cross Flow Micro Heat Exchanger*, Dec. 2000, Journal of Microelectromechanical Systems, vol. 9, No. 4, pp. 502-508.
George M. Harpole et al., *Micro-Channel Heat Exchanger Optimization*, 1991, Seventh IEEE Semi-Therm Symposium, pp. 59-63.
Pei-Xue Jiang et al., *Thermal-hydraulic performance of small scale micro-channel and prous-media heat-exchangers*, 2001, International Journal of Heat and Mass Transfer 44 (2001), pp. 1039-1051.
X.N. Jiang et al., *Laminar Flow Through Microchannels Used for Microscale Cooling Systems*, 1997, IEEE/CPMT Electronic Packaging Technology Conference, pp. 119-122, Singapore.
David Bazeley Tuckerman, *Heat-Transfer Microstructures for Integrated Circuits*, Feb. 1984, pp. ii-xix, pp. 1-141.
M Esashi, *Silicon micromachining for integrated microsystems*, 1996, Vacuum/vol. 47/Nos. 6-8/pp. 469-474.
T.S. Raviguruajan et al., *Effects of Heat Flux on Two-Phase Flow characteristics of Refrigerant Flows in a Micro-Channel Heat Exchanger*, HTD-vol. 329, National Heat Transfer Conference, vol. 7, ASME 1996, pp. 167-178.
T.S. Ravigruruajan et al., *Single-Phase Flow Thermal Performance Characteristics of a Parallel Micro-Channel*

*Heat Exchanger*, 1996, HTD-vol. 329, National Heat Transfer Conference, vol. 7, ASME 1996, pp. 157-166.
T.S. Ravigururajan et al., *Liquid Flow Characteristics in a Diamond-Pattern Micro-Heat-Exchanger*, DSC-vol. 59 Microelectromechanical Systems (IMEMS), ASME 1996, pp. 159-166.
T.S. Raviguruajan, *Impact of Channel Geometry on Two-Phase Flow Heat Transfer Characteristics of Refrigerants in Microchannel Heat Exchangers*, May 1998; Journal of Heat Transfer, vol. 120, pp. 485-491.
J. Pfahler et al., *Liquid Transport in Micron and Submicron Channels*, Mar. 1990, Sensors and Actuators, A21-A23 (1990), pp. 431-434.
Kenneth Pettigrew et al., *Performance of a MEMS based Micro Capillary Pumped Loop for Chip-Level Temperature Control*, 2001, The 14th IEEE International Conference on Micro Electro Mechanical Systems, pp. 427-430.
C. Perret et al., *Microchannel integrated heat sinks in silicon technology*, Oct. 12-15, 1998, The 1998 IEEE Industry Applications Conference, pp. 1051-1055.
X.F. Peng et al., *Convective heat transfer and flow friction for water flow in microchannel structures*, 1996, Int. J. Heat Mass Transfer, vol. 39, No. 12, pp. 2599-2608, printed in Great Britain.
X.F. Peng et al., *Experimental investigation of heat transfer in flat plates with rectangular microchannels*, 1994, Int. J. Heat Mass Transfer, vol. 38, No. 1, pp. 127-137, printed in Great Britain.
X.F. Peng et al., *Cooling Characteristics with Microchanneled Structures*, 1994, Enhanced Heat Transfer, vol. 1, No. 4, pp. 315-326, printed in the United States of America.
Yoichi Murakami et al., *Parametric Optimization of Multichanneled Heat Sinks for VLSI Chip Cooling*, Mar. 2002, IEEE Transaction on Components and Packaging Technologies, vol. 24, No. 1, pp. 2-9.
D. Mundinger et al., *High average power 2-D laser diode arrays or silicon microchannel coolers*, CLEO '89/Friday Morning/404.
L.J. Missaggia et al., *Microchannel Heat Sinks for Two-Dimensional High-Power-Density Diode Laser Arrays*, 1989, IEEE Journal of Quantum Electronics, vol. 25, No. 9, Sep. 1989, pp. 1989-1992.
M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45-50.
C.R. Friedrich et al., *Micro heat exchangers fabricated by diamond machining*, Jan. 1994, Precision Engineering, vol. 16, No. 1, pp. 56-59.
Mali Mahalingam, *Thermal Management in Semiconductor Device Packaging*, 1985, Proceedings of the IEEE, vol. 73, No. 9, Sep. 1985, pp. 1396-1404.
T.M. Adams et al., *An experimental investigation of single-phase forced convection in microchannels*, 1997, Int. J. Heat Mass Transfer, vol. 41, Nos. 6-7, pp. 851-857, Printed in Great Britain.
T.M. Adams et al., *Applicability of traditional turbulent single-phase forced convection correlations to non-circular micrhchannels*, 1999, Int. J. Heat and Transfer 42 (1999) pp. 4411-4415.
Bassam Badran et al., *Experimental Results for Low-Temperature Silicon Micromachined Micro Heat Pipe Arrays Using Water and Methanol as Working Fluids*, May 31, 1997, Experimental Heat Transfer, 10: pp. 253-272.
D. Jed Harrison et al., *Electroosmotic Pumping Within A Chemical Sensor System Integrated on Silicon*, Session C9 Chemical Sensors and Systems for Liquids, Jun. 26, 1991, pp. 792-795.
Kurt Seller et al., *Electroosmotic Pumping and Valveless Control of Fluid Flow within a Manifold of Capillaries on a Glass Chip*, 1994, Analytical Chemistry, vol. 66, No. 20, Oct. 15, 1994, pp. 3485-3491.
Philip H. Paul et al., *Electrokinetic Generation of High Pressures Using Porous Microstructures*, 1998, Micro-Total Analysis Systems, pp. 49-52.
Gh. Mohiuddin Mala et al., *Flow characteristics of water through a microchannel between two parallel plates with electrokinetic effects*, 1997, Int. J. Heat and Fluid Flow, vol. 18, No. 5, pp. 489-496.
W.E. Morf et al., *Partial electroosmotic pumping in complex capillary systems Part I: Principles and general theoretical approach*, Oct. 16, 2000, Sensors and Actuators B 72 (2001), pp. 266-272.
M. Esashi, *Silicon micromachining and micromachines*, Sep. 1, 1993, Wear, vol. 168, No. 1-2, (1993), pp. 181-187.
Stephanus Buttgenbach et al., *Microflow devices for miniaturized chemical analysis systems*, Nov. 4-5, 1998, SPIE-Chemical Microsensors and Applications, vol. 3539, pp. 51-61.
Sarah Arunlanandam et al., *Liquid transport in rectangular microchannels by electroosmotic pumping*, 2000, Colloids and Surfaces A: Physicochemical and Engineering Aspects vol. 161 (2000), pp. 89-102.
Linan Jiang et al., *Closed-Loop Electroosmotic Microchannel Cooling System for VLSI Circuits*, Mechanical Engineering Dept. Stanford University, pp. 1-27.
Susan L. R. Barker et al., *Fabrication, Derivatization and Applications of Plastic Microfluidic Devices*, Proceedings of SPIE, vol. 4205. Nov. 5-8, 2000, pp. 112-118.
Timothy E. McKnight et al., *Electroosmotically Induced Hydraulic Pumping with Integrated Electrodes on Microfluidic Devices*, 2001, Anal. Chem., vol. 73, pp. 4045-4049.
Chris Bourne, *Cool Chips plc Receives Nanotech Manufacturing Patent*, Jul. 31, 2002, pp. 1-2.
Frank Wagner et al., *Electroosmotic Flow Control in Micro Channels Produced by Scanning Excimer Laser Ablation*, 2000, Proceedings of SPIE vol. 4088, Jun. 14-16, 2000, pp. 337-340.
H. A. Goodman, *Data Processor Cooling With Connection To Maintain Flow Through Standby Pump*, Dec. 1983, IBM Technical Disclosure Bulletin, vol. 26, No. 7A, p. 3325.
*Electroerosion Micropump*, May 1990, IBM Technical Disclosure Bulletin, vol. 32, No. 12, pp. 342-343.
Shulin Zeng et al., *Fabrication and Characterization of Electrokinetic Micro Pumps*, 2000 Inter Society Conference on Thermal Phenomena, pp. 31-35.
A. Manz et al., *Integrated Electroosmotic Pumps and Flow Manifolds for Total Chemical Analysis System*, 1991, Inter. Conf. on Solid-State Sensors and Actuators, pp. 939-941.
O.T. Guenat et al., *Partial electroosmotic pumping in complex capillary systems Part: 2 Fabrication and application of a micro total analysis system suited for continuous volumetric nanotitrations*, Oct. 16, 2000, Sensors and Actuators B 72 (2001) pp. 273-282.
J.G. Sunderland, *Electokinetic dewatering and thickening. I. Introduction and historical review of electrokinetic applications*, Sep. 1987, Journal of Applied Electrochemistry vol. 17, No. 5, pp. 889-898.

J. C. Rife et al., *Acousto- and electroosmotic microfluidic controllers*, 1998, Microfluidic Devices and Systems, vol. 3515, pp. 125-135.

Purnendu K Dasgupta et al., *Electroosmosis: A Reliable Fluid Propulsion System for Flow Injection Analysis*, 1994, Anal. Chem., vol. 66, No. 11, pp. 1792-1798.

Ray Beach et al., *Modular Microchannel Cooled Heatsinks for High Average Power Laser Diode Arrays*, Apr. 1992, IEEE Journal of Quantum Electronics, vol. 28, No. 4, pp. 966-976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754-760.

Y. Zhuang et al., *Experimental study on local heat transfer with liquid impingement flow in two-dimensional micro-channels*, 1997, Int. J. Heat Mass Transfer, vol. 40, No. 17, pp. 4055-4059.

D. Yu et al., *An Experimental and Theoretical Investigation of Fluid Flow and Heat Transfer in Microtube*, 1995, ASME / JSME Thermal Engineering Conference, vol. 1, pp. 523-530.

Xiaoqing Yin et al., *Micro Heat Exchangers Consisting of Pin Arrays*, 1997, Journal of Electronic Packaging Mar. 1997, vol. 119, pp. 51-57.

X. Yin et al., *Uniform Channel Micro Heat Exchangers*, 1997, Journal of Electronic Packaging Jun. 1997, vol. 119, No. 2, pp. 89-94.

Chun Yang et al., *Modeling forced liquid convection in rectangular microchannels with electrokinetic effect*, 1998, International Journal of Heat and Mass Transfer 41 (1998), pp. 4229-4249.

Arel Weisberg et al., *Analysis of microchannels for integrated cooling*, 1992, Int. J. Heat Mass Transfer, vol. 35, No. 10, pp. 2465-2473.

Roger S. Stanley et al., *Two-Phase Flow in Microchannels*, 1997, DSE-vol. 62/HTD-vol. 354, MEMS, pp. 143-152.

B. X. Wang et al., *Experimental investigation on liquid forced-convection heat transfer through microchannels*, 1994, Int. J. Heat Mass Transfer, vol. 37 Suppl. 1, pp. 73-82.

Kambiz Vafai et al., *Analysis of two-layered micro-channel heat sink concept in electronic cooling*, 1999, Int. J. Heat Mass Transfer, 42 (1999), pp. 2287-2297.

Gokturk Tune et al., *Heat transfer in rectangular microchannels*, 2002, Int. J. Heat Mass Transfer, 45 (2002), pp. 765-773.

D. B. Tuckerman et al., *High-Performance Heat Sinking for VLSI*, 1981, IEEE Electron Device Letters, vol. EDL-2, No. 5, pp. 126-129.

Bengt Sunden et al., *An Overview of Fabrication Methods and Fluid Flow and Heat Transfer Characteristics of Micro Channels*, pp. 3-23.

David S. Shen et al., *Micro Heat Spreader Enhance Heat Transfer in MCMs*, 1995, IEEE Multi-Chip Module Conference, pp. 189-194.

S. Sasaki et al., *Optimal Structure for Microgrooved Cooling Fin for High-Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611-617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology-part B, vol. 19, No. 2, pp. 444-451.

Charlotte Gillot et al., *Integrated Single and Two-Phase Micro Heat Sinks Under IGBT Chips*, IEEE Transactions on Components and Packaging Technology, vol. 22 No. 3, Sep. 1999, pp. 384-389.

X.F. Peng et al., "Enhancing the Critical Heat Flux Using Microchanneled Surfaces", Enhanced Heat Transfer, 1998, vol. 5 pp. 165-176.

H. Krumm "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

* cited by examiner

HERMETIC CLOSED LOOP FLUID SYSTEM

RELATED APPLICATION

This Patent Application claims priority under 35 U.S.C. 119(e) of the U.S. Provisional Patent Application, Ser. No. 60/489,730 filed Jul. 23, 2003, and entitled "PUMP AND FAN CONTROL APPARATUS AND METHOD IN A CLOSED FLUID LOOP". The Provisional Patent Application, Ser. No. 60/489,730 filed Jul. 23, 2003, and entitled "PUMP AND FAN CONTROL APPARATUS AND METHOD IN A CLOSED FLUID LOOP" is also hereby incorporated by reference.

FIELD OF THE INVENTION

The invention relates to a fluid circulating system in general, and specifically, to a hermetic closed loop fluid system.

BACKGROUND OF THE INVENTION

Many heating and cooling systems are used in all aspects of industry to regulate the temperature of a heat source, wherein the fluid systems are closed loop and are sealed to prevent substantial leakage of working fluid from the system. Existing heating and cooling fluid systems use flexible hoses, gaskets, clamps, and other seals to attempt to provide a sealed environment within the system. However, the material and structural characteristics of these mechanical components cause a slow loss of fluid from the fluid system over a period of time. The loss of fluid occurs due to evaporation as well as permeation of fluid and vapor through the materials of the components and the seals which connect the individual components of the system together. As used herein, permeability refers to the ease at which a fluid or vapor transports through a material.

One example of a cooling system is a system for cooling the engine in an automobile, whereby the cooling system uses rubber hoses, gaskets and clamps. As stated above, the structural and mechanical characteristics of these devices have a high permeability which allows cooling fluid to escape from the system at a high rate. Nonetheless, it is common in the automotive industry for automotive manufacturers to recommend frequent checks of the fluid level in the cooling system and occasional refilling of the lost fluid. The requirement for fluid refilling in automotive applications is tolerated, because of the low cost and high mechanical reliability of the materials of which the components are made.

However, for a closed loop fluid system which regulates the temperature of a circuit in a personal computer, server, or other electronic device, there can be no such requirement for customers to check and refill fluid levels in the cooling systems. In microprocessor cooling systems, replacing fluid which has been lost would be very burdensome and expensive due to the difficulty of dismantling the cooling system and replacing the small scale components. In addition, refilling of fluid in a microprocessor cooling system would cause great potential for equipment failures, safety risks, and loss of data owing to a short circuit caused by spilled fluid. In essence, it is desired that the microprocessor cooling system operate for the entire life of the product without requiring any periodic maintenance. Therefore, containment of the circulating fluid in the cooling system is a design goal in electronic systems cooling equipment, and the use of fluids in computer equipment cooling systems is commercially feasible if there is no risk of fluid or vapor escaping from the cooling system.

Cooling systems using fluids which regulate the temperature of a microprocessor exist in the market. However, the components in these existing cooling systems are made of plastic, silicone and rubber components which are secured together by hose clamps. The permeability and diffusion rates of single phase and two phase fluid through these components into the surrounding environment are unacceptably high due to the materials of which these components are made. The high permeability and diffusion rates of these materials make it almost impossible to prevent escape of the fluid from the cooling system. Therefore, the cooling system is not able to maintain its integrity over the expected life of the system and eventually dry up as well as create humidity within the computer chassis.

What is needed is a hermetic closed loop fluid system for regulating the temperature of an electronic device in a product, whereby the fluid system is configured to prevent significant loss of fluid over the life of the product.

SUMMARY OF THE INVENTION

In one aspect of the present invention a closed loop fluid pumping system controls a temperature of an electronic device. The system comprises at least one pump, at least one heat exchanger coupled to the electronic device and configured to pass a fluid therethrough, wherein the fluid performs thermal exchange with the electronic device, at least one heat rejector, and fluid interconnect components to couple the at least one pump, the at least one heat exchanger and the at least one heat rejector, wherein the closed loop fluid pumping system losses up to a predetermined maximum amount of the fluid over a desired amount of operating time. The fluid can be a single phase fluid. The fluid can be a two phase fluid. The at least one pump can be made of a material having a desired permeability. The at least one pump can be made of a metal, a ceramic, a glass, a plastic, a metalized plastic, or any combination thereof. The fluid interconnect components can be made of a material with a desired permeability. The fluid interconnect components can be made of a metal, a ceramic, a glass, a plastic, a metalized plastic, or any combination thereof. The fluid interconnect components can be coupled to the at least one pump, the at least one heat exchanger, and the at least one heat rejector by adhesives, solder, welds, brazes, or any combination thereof. The fluid interconnect components can include a sealing collar configured to be positioned between the at least one pump, the at least one heat exchanger, or the at least one heat rejector and a fluid tube. The sealing collar can include a thermal expansion coefficient substantially similar to a thermal expansion coefficient of the at least one pump, the at least one heat exchanger, or the at least one heat rejector to which the sealing collar is coupled. The sealing collar can include a ductility characteristic to provide a sealed junction with the fluid tube. The sealing collar can be sealably coupled to the at least one pump, the at least one heat exchanger, or the at least one heat rejector and the fluid tube using compression fitting. The closed loop fluid pumping system can lose less than 0.89 grams of fluid per year. The closed loop fluid pumping system can lose less than 1.25 grams of fluid per year. The closed loop fluid pumping system can lose less than 2.5 grams of fluid per year.

In another aspect of the present invention, a closed loop fluid pumping system controls a temperature of an electronic device. The system comprises at least one pump, at least one heat exchanger coupled to the electronic device and configured to pass a fluid therethrough, wherein the fluid performs thermal exchange with the electronic device, at least one heat rejector, and fluid interconnect components to couple the at least one pump, the at least one heat exchanger and the at least one heat rejector, wherein the closed loop fluid pumping system losses less than 0.89 grams of fluid per year. The fluid can be a single phase fluid. The fluid can be a two phase fluid. The at least one pump can be made of a material having a desired permeability. The at least one pump can be made of a metal, a ceramic, a glass, a plastic, a metalized plastic, or any combination thereof. The fluid interconnect components can be made of a material with a desired permeability. The fluid interconnect components can be made of a metal, a ceramic, a glass, a plastic, a metalized plastic, or any combination thereof. The fluid interconnect components can be coupled to the at least one pump, the at least one heat exchanger, and the at least one heat rejector by adhesives, solder, welds, brazes, or any combination thereof. The fluid interconnect components can include a sealing collar configured to be positioned between the at least one pump, the at least one heat exchanger, or the at least one heat rejector and a fluid tube. The sealing collar can include a thermal expansion coefficient substantially similar to a thermal expansion coefficient of the at least one pump, the at least one heat exchanger, or the at least one heat rejector to which the sealing collar is coupled. The sealing collar can include a ductility characteristic to provide a sealed junction with the fluid tube. The sealing collar can be sealably coupled to the at least one pump, the at least one heat exchanger, or the at least one heat rejector and the fluid tube using compression fitting.

In yet another aspect of the present invention, a closed loop fluid pumping system controls a temperature of an electronic device. The system comprises at least one pump, at least one heat exchanger coupled to the electronic device and configured to pass a fluid therethrough, wherein the fluid performs thermal exchange with the electronic device, at least one heat rejector, and fluid interconnect components to couple the at least one pump, the at least one heat exchanger and the at least one heat rejector, wherein the closed loop fluid pumping system losses less than 1.25 grams of fluid per year. The fluid can be a single phase fluid. The fluid can be a two phase fluid. The at least one pump can be made of a material having a desired permeability. The at least one pump can be made of a metal, a ceramic, a glass, a plastic, a metalized plastic, or any combination thereof. The fluid interconnect components can be made of a material with a desired permeability. The fluid interconnect components can be made of a metal, a ceramic, a glass, a plastic, a metalized plastic, or any combination thereof. The fluid interconnect components can be coupled to the at least one pump, the at least one heat exchanger, and the at least one heat rejector by adhesives, solder, welds, brazes, or any combination thereof. The fluid interconnect components can include a sealing collar configured to be positioned between the at least one pump, the at least one heat exchanger, or the at least one heat rejector and a fluid tube. The sealing collar can include a thermal expansion coefficient substantially similar to a thermal expansion coefficient of the at least one pump, the at least one heat exchanger, or the at least one heat rejector to which the sealing collar is coupled. The sealing collar can include a ductility characteristic to provide a sealed junction with the fluid tube. The sealing collar can be sealably coupled to the at least one pump, the at least one heat exchanger, or the at least one heat rejector and the fluid tube using compression fitting.

In still yet another aspect of the present invention, a closed loop fluid pumping system controls a temperature of an electronic device. The system comprises at least one pump, at least one heat exchanger coupled to the electronic device and configured to pass a fluid therethrough, wherein the fluid performs thermal exchange with the electronic device, at least one heat rejector, and fluid interconnect components to couple the at least one pump, the at least one heat exchanger and the at least one heat rejector, wherein the closed loop fluid pumping system losses less than 2.5 grams of fluid per year. The fluid can be a single phase fluid. The fluid can be a two phase fluid. The at least one pump can be made of a material having a desired permeability. The at least one pump can be made of a metal, a ceramic, a glass, a plastic, a metalized plastic, or any combination thereof. The fluid interconnect components can be made of a material with a desired permeability. The fluid interconnect components can be made of a metal, a ceramic, a glass, a plastic, a metalized plastic, or any combination thereof. The fluid interconnect components can be coupled to the at least one pump, the at least one heat exchanger, and the at least one heat rejector by adhesives, solder, welds, brazes, or any combination thereof. The fluid interconnect components can include a sealing collar configured to be positioned between the at least one pump, the at least one heat exchanger, or the at least one heat rejector and a fluid tube. The sealing collar can include a thermal expansion coefficient substantially similar to a thermal expansion coefficient of the at least one pump, the at least one heat exchanger, or the at least one heat rejector to which the sealing collar is coupled. The sealing collar can include a ductility characteristic to provide a sealed junction with the fluid tube. The sealing collar can be sealably coupled to the at least one pump, the at least one heat exchanger, or the at least one heat rejector and the fluid tube using compression fitting.

In another aspect of the present invention, a method of manufacturing a closed loop fluid pumping system controls the temperature of an electronic device. The method comprises forming at least one heat exchanger to be configured in contact with the electronic device and to pass a fluid therethrough, wherein the fluid performs thermal exchange with the electronic device, forming at least one pump, forming at least one heat rejector, forming fluid interconnect components, and coupling the at least one heat exchanger to the at least one pump and to the at least one heat rejector using the fluid interconnect components, thereby forming the closed loop fluid pumping system, wherein the closed loop fluid pumping system is formed to loss less than a predetermined amount of the fluid over a desired amount of operating time. The fluid can be a single phase fluid. The fluid can be a two phase fluid. The at least one pump can be formed of a material having a desired permeability. The at least one pump can be formed of a metal, a ceramic, a glass, a plastic, a metalized plastic, or any combination thereof. The fluid interconnect components can be formed of a material with a desired permeability. The fluid interconnect components can be formed of a metal, a ceramic, a glass, a plastic, a metalized plastic, or any combination thereof. The fluid interconnect components can be coupled to the at least one pump, the at least one heat exchanger, and the at least one heat rejector by adhesives, solder, welds, brazes, or any combination thereof. The fluid interconnect components can include a sealing collar configured to be positioned between the at least one pump, the at least one heat exchanger, or the at least one heat rejector and a fluid tube. The sealing collar can include a thermal expansion coefficient substantially similar to a thermal expansion coefficient of the at least one pump, the at least one heat exchanger, or the at least one heat rejector to which the sealing collar is coupled. The sealing collar can include a ductility characteristic to provide a sealed junction with the fluid tube. The sealing collar can be sealably coupled to the at least one pump, the at least one heat exchanger, or the at least one heat rejector and the fluid tube using compression fitting. The closed loop fluid pumping system can lose less than 0.89 grams of fluid per year. The closed loop fluid pumping system can lose less than 1.25 grams of fluid per year. The closed loop fluid pumping system can lose less than 2.5 grams of fluid per year.

DETAILED DESCRIPTION OF THE PRESENT INVENTION

Figure 1:
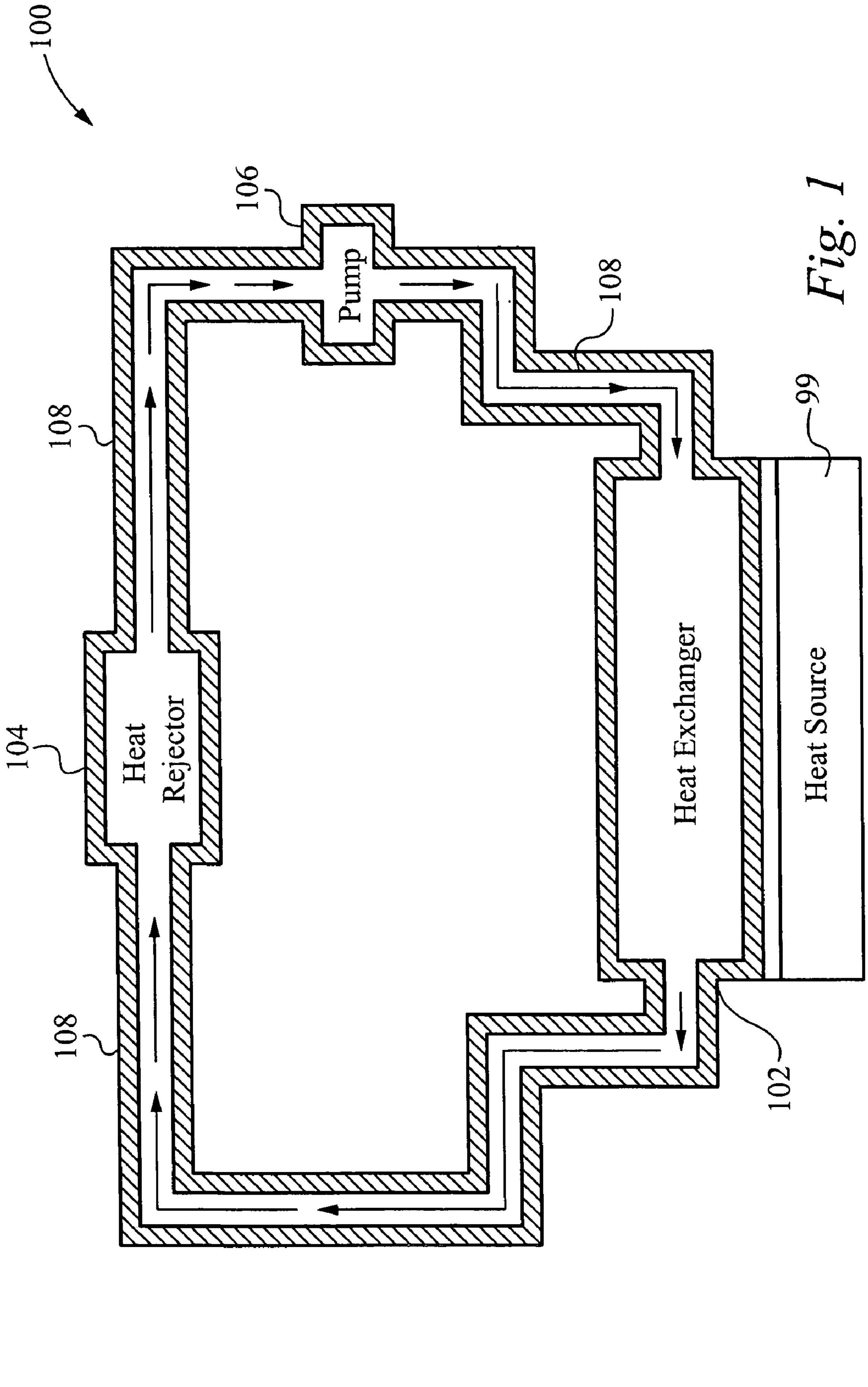
FIG. 1 illustrates a block diagram of the hermetic closed loop fluid system in accordance with the present invention.

FIG. 1 illustrates a block diagram of a hermetic closed loop fluid system 100 in accordance with the present invention. As shown in FIG. 1, the hermetic closed loop system 100 preferably cools an electronic device 99 such as a computer microprocessor. The fluid system 100 preferably includes at least one pump 106, at least one heat exchanger 102 and at least one heat rejector 104. As shown in FIG. 1, the heat exchanger 102 is coupled to the heat rejector 104 by one or more fluid lines 108. In addition, the heat rejector 104 is coupled to the pump 106 by one or more fluid lines 108. Similarly, the pump 106 is coupled to the heat exchanger 102 by one or more fluid lines 108. It is apparent to one skilled in the art that the present system 100 is not limited to the components shown in FIG. 1 and alternatively includes other components and devices.

The purpose of the hermetic closed fluid loop 100 shown in FIG. 1 is to capture heat generated by the electronic device 99. In particular, the fluid within the heat exchanger 102 performs thermal exchange by conduction with the heat produced via the electronic device 99. The fluid within the system 100 can be based on combinations of organic solutions, including but not limited to propylene glycol, ethanol and isopropanol (IPA). The fluid used in the present system 100 also preferably exhibits a low freezing temperature and has anti-corrosive characteristics. Depending on the operating characteristics of the fluid system 100 and the electronic device 99, in one embodiment, the fluid exhibits single phase flow while circulating within the system 100. In another embodiment, the fluid is heated to a temperature to exhibit two phase flow, wherein the fluid undergoes a phase transition from liquid to a vapor or liquid/vapor mix. As will be discussed below, the amount of fluid which escapes from the system over a given time depends on whether the fluid exhibits single or two phase characteristics.

The heated fluid flows out from the heat exchanger 102 via the fluid lines 108 to the heat rejector 104. The heat rejector 104 transfers the heat from the heated fluid to the surrounding air, thereby cooling the heated fluid to a temperature which allows the fluid to effectively cool the heat source 99 as it re-enters the heat exchanger 102. The pump 106 pumps the fluid from the heat rejector 104 to the heat exchanger 102 as well as circulates the fluid through the cooling system 100 via the fluid lines 108. The cooling system 100 thereby provides efficient capture and movement of the heat produced by the electronic device 99.

Preferably the pump 106 is an electroosmotic type pump shown and described in co-pending patent application Ser. No. 10/669,495, filed Sep. 23, 2003, which is hereby incorporated by reference. However, it is apparent to one skilled in the art that any type of pump is alternatively contemplated. Preferably, the heat exchanger 102 is shown and described in co-pending patent application Ser. No. 10/680,584, filed Oct. 6, 2003, which is hereby incorporated by reference. However, it is apparent to one skilled in the art that any type of heat exchanger is alternatively contemplated. Preferably, the heat rejector 104 is shown and described in co-pending patent application Ser. No. 10/699,505, filed Oct. 30, 2003, which is hereby incorporated by reference. However, it is apparent to one skilled in the art that any type of heat rejector is alternatively contemplated.

The closed loop fluid system 100 of the present invention is hermetic and is configured to minimize loss of the fluid in the system and to maintain a total volume of the fluid in the system above a predetermined quantity over a desired amount of time. In particular, an acceptable amount of fluid loss, or acceptable threshold of hermeticity, in the present system 100 is defined based on variety of factors including, but not limited to, the type and characteristics as well as the expected life of the product which utilizes the present system 100 within. The life of the product depends on the nature of the product as well as other factors. However, for illustration purposes only, the life of the product herein is designated as 10 years, although any amount of time is alternatively contemplated. The present system 100 achieves a hermetic environment by utilizing components which comprise the desired dimensions and materials to minimize the fluid loss over a predetermined amount of time. Such components include, but are not limited to, the heat exchanger 102, heat rejector 104, pump 106 and fluid lines 108 (FIG. 1). Consideration must also be made for the interconnections between each of the components and the potential fluid loss resulting therefrom.

For the fluid system of the present invention 100 to properly operate, a sufficient amount of liquid fluid must be available at the inlet of the pump 106 at all times to allow the pump 106 to continue pumping the fluid throughout the system 100. The total amount of liquid volume depends on a variety of factors including, but not limited to, the type of pump, heat exchanger and heat condensor used, whether the heat-transfer process involves single-phase or two-phase flow, and the materials used.

For closed loop fluid systems, preferred designs are those which retain fluids through the choice of materials and design of connections. Preferably, the closed-loop fluid system for electronic cooling will lose less than 0.89 gm of fluid/year. Alternately, the closed loop fluid system for electronics cooling will lose less than 1.25 gm of fluid/year. Still alternately, the closed-loop fluid system for electronics cooling will lose less than 2.5 gm of fluid/year. It should be noted that these values are for illustration purposes only, and the present invention is not limited to these values or parameters.

The fluid escapes from the fluid system 100 by permeation of the components used. Diffusion occurs when a single phase or two phase fluid travels through a material from one side to the other side over a period of time. Within the setting of a closed loop fluid system, the fluid escapes from the system to the surroundings of the system by "leaking" through the actual material of the components. The rate of diffusion of the fluid through the material is dependent on the permeability characteristics of the material, which is a function of temperature. In addition, the rate of diffusion of the fluid is dependent on the surface area and thickness dimensions of the components which enclose the fluid. For instance, fluid within a fluid tube 108 having a certain diameter and thickness will diffuse through the tube 108 at a slower rate than through a fluid tube 108 of the same material having a larger diameter and a smaller thickness. In a fluid system which circulates fluid with at least some finite amount of vapor, the pressure differential between the pressure inside and outside of the component affects the rate of diffusion of the fluid. In other words, the pressure from a two phase fluid, or single phase fluid with a finite amount of vapor, is capable of diffusing the vapor into and through the material of the component. Therefore, the dimensions of the component, the pressure of the fluid, as well as the material of the component determine the rate at which the fluid diffuses or escapes from the system 100.

In addition, the pressure versus temperature relationship of a two phase fluid is a factor in determining the liquid-vapor transition temperature which determines the operating temperature of the fluid in the cooling loop system 100. For instance, to achieve a boiling point at a lower temperature than under ambient pressure, the overall pressure within system 100 is reduced to the desired level. However, if the partial pressure in the air surrounding the outside of the component is lower than the pressure within the component, there will be a pressure differential for that gas species. The pressure differential will then tend to cause the vapor within the component to diffuse through the component material to the surrounding area to equalize the pressure between the interior of the component and the surroundings of the component. The permeability of vapor through the walls of the component is defined in terms of cubic centimeters ($cm^3$) of vapor at standard temperature and pressure (STP) which is diffused per unit area of a given thickness and pressure difference.

Alternatively, for the case where the interior of the system is at a very low pressure, and there is a gas species in the surrounding atmosphere at a relatively high pressure, diffusion can allow movement of gas from the outside to the inside. For example, a cooling loop filled with fluid and some $O_2$ and $H_2$ gas will have essentially no $N_2$ gas on the inside. Exterior to the loop, the surrounding air contains a relatively high fraction of $N_2$ gas, so that the partial pressure of $N_2$ on the outside of the loop might be as much as 70% of an atmosphere. 70% of an atmosphere is a net pressure difference forcing diffusion of nitrogen from the outside to the inside. In the preferred embodiment of the present invention, the system is designed to account for the gas species in the surrounding air as well as for the gas species trapped within the loop.

The hermetic closed loop fluid system 100 of the present invention utilizes components which are made of low permeable materials and configures the components according to proper dimensions thereby minimizing loss of fluid over the desired operating life of the system 100. In addition to the components, the fittings and coupling members used in the present system 100 are made of materials having a low permeability. Therefore, the components, fittings, and coupling members within the system 100 of the present invention are preferably made of ceramics, glass and/or metals. Alternatively, the components are made of any other appropriate material which allows a fluid permeability rate of less than 0.01 grams millimeters per meter squared per day (gm-mm/$m^2$-day). Such appropriate materials include, but are not limited to, metal, ceramic, glass, plastic, metalized plastic, and any combination thereof.

Figure 2:
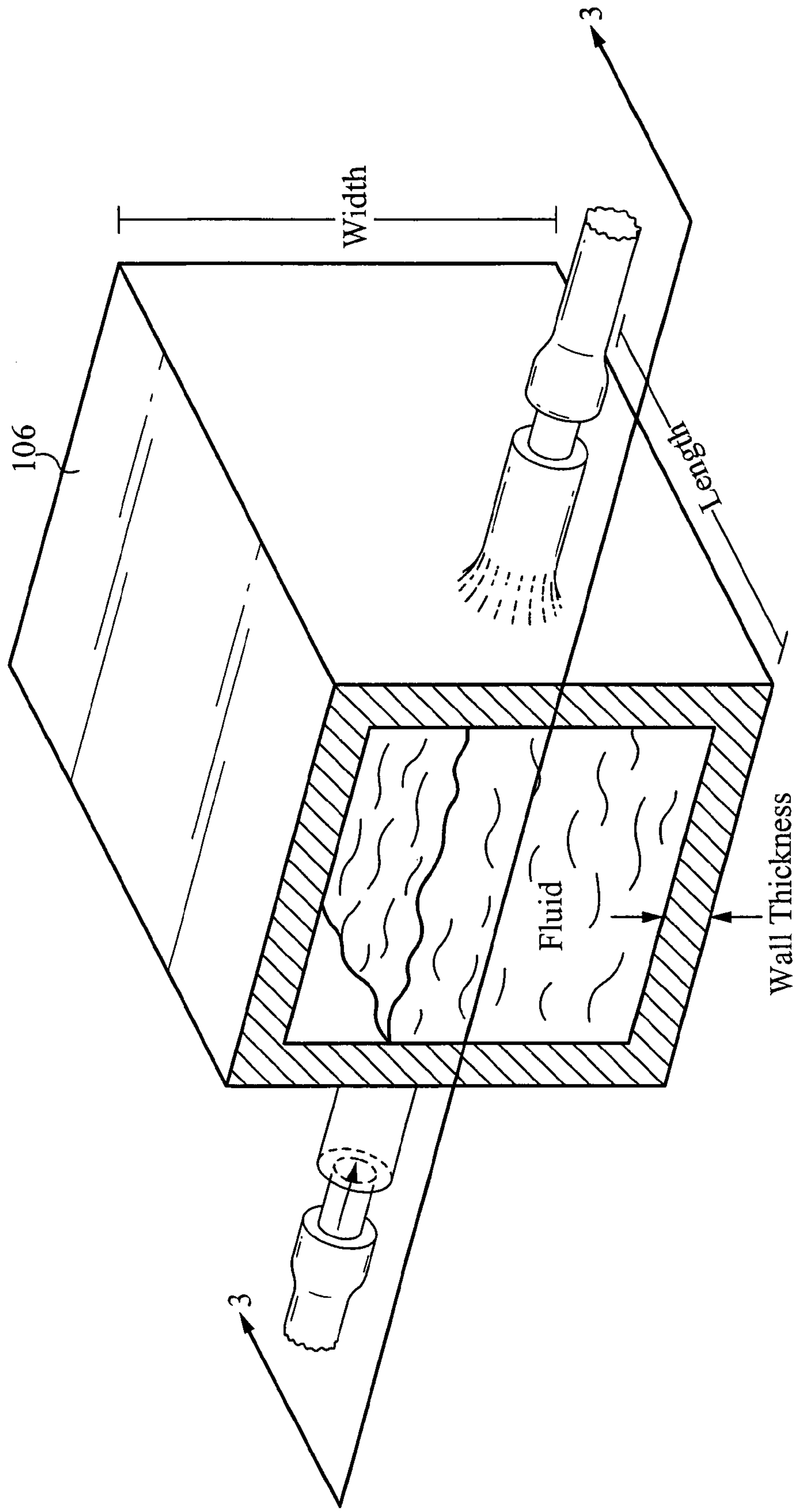
FIG. 2 illustrates a general schematic of a component for use in the hermetic closed loop fluid system of the present invention.

As stated above, the amount of a single phase fluid which permeates through a component being made of a material having a permeability rate of 0.01 gm-mm/$m^2$-day in one year depends on the dimensions of the component. For instance, a component in the system 100 having a total surface area of 100 $cm^2$ and a wall thickness of 1 mm will have a fluid loss of less than 0.4 $cm^3$ in a ten year period. It should be noted that these dimensions are exemplary and any other length, width and thickness dimensions (FIG. 2) are contemplated. It should also be noted that the dimensions and rates described herein are approximations.

Table 1 lists the approximate permeability rates of Hydrogen, Oxygen, and Nitrogen through various materials.

| Barrier Material | Diffusing Species | Permeability Coefficient ($cm^3$ (STP)-mm/$m^2$/day) |
|---|---|---|
| Polyethylene (HDPE) | Nitrogen | 14 |
| Polyethylene (HDPE) | Hydrogen | 126 |
| Polyethylene (HDPE) | Oxygen | 40 |
| Polyethylene (HDPE) | Water Vapor | 300 |
| Polyester (PET) | Nitrogen | 0.4 |
| Polyester (PET) | Hydrogen | 40 |
| Polyester (PET) | Oxygen | 1.1 |
| Polyester (PET) | Water Vapor | 250 |
| EVOH | Nitrogen | 0.003 |
| EVOH | Hydrogen | 1 |
| EVOH | Oxygen | 0.01 |
| EVOH | Water Vapor | 300 |
| Polyimide (Kapton) | Nitrogen | 30 |
| Polyimide (Kapton) | Hydrogen | 1500 |
| Polyimide (Kapton) | Oxygen | 100 |
| Polyimide (Kapton) | Water Vapor | 300 |
| Copper | Hydrogen | $<1 \times 10^{-3}$ |
| Kovar | Hydrogen | $<1 \times 10^{-2}$ |
| Aluminum | Hydrogen | $<1 \times 10^{-5}$ |
| 7740 glass | Nitrogen | $<1 \times 10^{-6}$ |
| Silicone Rubber | Water Vapor | 2,000 |
| Polybutadiene Rubber | Water Vapor | 20,000 |

Consider the permeation of water vapor for a sealed, water-filled system. In an exemplary case, a water-filled system includes a surface area of 100 $cm^2$, and a thickness of 1 mm. Referring to Table 1, the permeation rate for water vapor through Polyethylene (HDPE) is about 3 $cm^3$ of water vapor at STP per day. This is approximately equivalent to $3\times10^{-3}$ $cm^3$ of liquid water loss per day, or about 1 mL loss per year. If any of the components of a polymer-based cooling loop are composed of silicone or polybutadiene rubber, these loss rates can be 10–100 times worse.

The ability for the fluid to diffuse through the inner walls of the components, which are made of the preferred materials discussed above, is significantly lower than through a plastic, silicone or rubber material. For example, the permeability of hydrogen gas through copper at room temperature is approximately $1\times10^{-3}$ $cm^3$ (STP)-mm/$m^2$/day. Therefore, a component, such as the fluid tube 108, made of copper which has a surface area of 100 $cm^2$ area and being 1 mm thick, will allow a permeation or leakage rate of approximately 0.003 $cm^3$ of hydrogen gas/year. Over a 10 year period, the copper fluid tube 108 will allow less than 0.03 $cm^3$ of hydrogen to escape into or out of the system 100. These calculations are all based on a situation with an atmosphere (100 kPa) of $H_2$ pressure on one side of the barrier and no $H_2$ on the other side, which is an extreme case.

The permeability rate of nitrogen gas through the 7740 glass material is between 1 and $2\times10^{-16}$ $cm^2$/sec, which converts to about 1×10−6 $cm^3$ (STP)-mm/$m^2$/day. For example, a component in the fluid system 100 made of 7740 glass which has a surface area of 100 $cm^2$ and a thickness of 1 mm will allow less than $4\times10^{-5}$ $cm^3$ of STP nitrogen into or out of the system in a year, and less than $4\times10^{-4}$ $cm^3$ of STP nitrogen into or out of the system in 10 years. In contrast, nitrogen permeability in polyethylene can be as high as 100 $cm^3$ (STP)-mm/$m^2$-day. Thus, if the present system 100 operates with an internal volume of 100 $cm^3$ of fluid, 90% of which is liquid and 10% of which is vapor, the permeability value of the polyethylene would allow almost all of the pressurized vapor to diffuse through the walls of the components in a short amount of time. In other words, nitrogen gas will diffuse through the walls of a component in the present system 100 made of 7740 glass $10^7$ times slower than if the component was made of polyethylene.

Other materials, such as Polyester and Ethylene Vinyl Alcohol Copolymer (EVOH) have lower permeability values compared to polyethylene. However, polyester has a permeability of approximately 1 $cm^3$ (STP)-mm/$m^2$/day for oxygen and approximately 0.4 $cm^3$ (STP)-mm/$m^2$/day for nitrogen, and EVOH has a permeability of approximately 0.003 $cm^3$ (STP)-mm/$m^2$/day for nitrogen and approximately 0.01 $cm^3$ (STP)-mm/$m^2$/day for oxygen. Although EVOH and polyester are generally a preferred choice of organic material used in other sealing environments, such as for food packaging, they are inadequate for hermetic cooling loop applications. Compared to the metal materials, the permeability numbers are about 1000 times higher for the organic materials. For cases where there is possible presence of hydrogen, the much larger permeability numbers for hydrogen in the organic materials make them unacceptable for hermetic loop applications. The permeability of hydrogen for both polyester and EVOH are 50 times or more worse than for nitrogen and oxygen, and would allow very significant hydrogen diffusion.

Very thin films of aluminum are currently used in food packaging, and are known to significantly reduce the water vapor permeation through mylar films. For example, 100–300 angstroms of aluminum reduces the permeation rate through a plastic film to less than 5 ($cm^3$ (STP) mm/$m^2$/day), which is almost 10 times better than any mm-thickness of any of the polymer films in Table 1, and this residual permeation rate is attributed to defects in the film. Macroscopic metal structures do not exhibit any measurable permeation of water vapor or any atmospheric constituents.

In addition, the above permeability values for polyethylene, polyester and EVOH are provided at Standard Temperature and Pressure. As stated above, closed loop fluid system usually operate at temperatures and pressure above the STP temperature range, whereby the permeability values increase with increased temperatures. Therefore, the vapor within a system utilizing polyethylene, polyester or EVOH components will diffuse through the components at faster rate than the figures mentioned herein.

The type of fluid used within the closed loop system 100 is a design decision, and therefore, the diffusion species contemplated by the present invention can extend beyond nitrogen, oxygen, and hydrogen, as shown in Table 1. Where other diffusion species are contemplated, the choice of barrier material is preferably determined as to minimize diffusion of the diffusion species through the barrier material.

The components in the system 100 of the present invention which are made of metal are preferably sealed by soldering, welding, brazing, or crimping. Components used in the present system 100 which are made of glass parts are preferably sealed with sealing glass, solder or by fusing. Components used in the present system 100 which are made of ceramic material are preferably sealed with ceramic-based epoxy or sealed by soldering.

Figure 3:
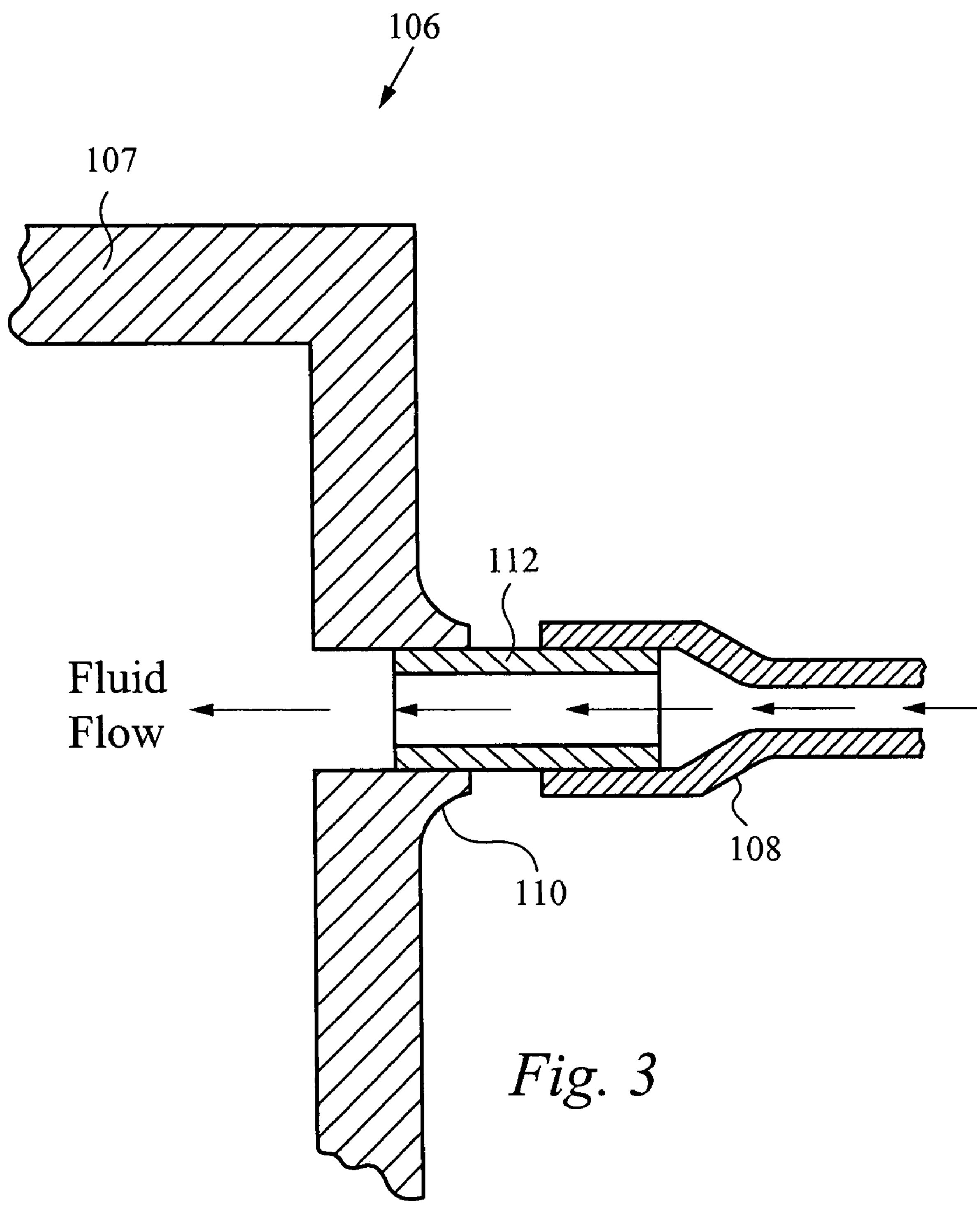
FIG. 3 illustrates a detailed cross sectional view of a first interconnection between a pump, or component, port and a fluid tube for use in the hermetic closed loop fluid system of the present invention.

FIG. 3 illustrates a first interconnection between the fluid tube 108 and a component port 110. As illustrated in FIG. 3, the component port 110 comprises the inlet port of the pump housing 106. The fluid tubes 108 are preferably made of Copper, whereby each Copper tube 108 is preferably coupled to each component port 110 with a sealing collar 112. Alternatively, the fluid tubes 108 are made of another appropriate material having a desired low permeability. As shown in FIG. 3, the inlet fluid tube 108 is coupled to the inlet fluid port 110 of the pump 106, whereby the sealing collar 112 is positioned between the inner surface of the fluid tube 108 and the inner surface of the fluid port 110. The sealing collar 112 is preferably made of Tungsten or any other appropriate material which has a coefficient of thermal expansion (CTE) that closely matches the material of the fluid port 110. Unless the pump 106 is made of the same material as the fluid tube 108, the CTE of the sealing collar 112 material will probably not match that of the fluid tube 108 material. However, the sealing collar 112 is preferably selected to have an appropriate ductility to maintain a seal with the fluid tube 108 material regardless of the amount of expansion or contraction experienced by the fluid tube 108. Although the sealing collar 112 is described in relation to the inlet port 110 of the pump 106, it is apparent to one skilled in the art that the sealing collar 112 is also preferably utilized between the fluid tubes and the inlet and outlet ports of the other components in the present system 100.

The sealing collar 112 is preferably coupled to the fluid hose 108 and the inlet port 110 using compression fitting. Compression fitting is preferably accomplished by heating the pump housing 107, thereby increasing the size of the inlet port 110. A first end of the sealing collar 112 is then placed in the expanded inlet port 110, and the housing 107 is allowed to cool, and contract, forming a seal around the sealing collar 112. Similarly, the fluid tube 108 is heated, whereby the fluid tube 108 expands to allow a slip fit over a second end of the sealing collar 112. The sealing collar 112 is then inserted in the expanded fluid tube 108, and the fluid tube 108 is allowed to cool, and contract, forming a seal around the sealing collar 112. The compression fitting of the inlet port 110 and the fluid tube 108 to the sealing collar 112 can be accomplished by first coupling the sealing collar 112 to the inlet port 110 and then coupling the sealing collar 112 to the fluid tube 108, as described above, or by reversing the steps. Alternatively, the sealing collar 112 can be coupled to the inlet port 110 and the fluid tube 108 simultaneously, that is by heating both the housing 107 and the fluid tube 108, and then inserting the first end of the sealing collar 112 in the expanded inlet port 110 and inserting the second end of the sealing collar 112 in the expanded fluid hose 108. The housing 107 and the fluid tube 108 are then both allowed to cool, and contract, forming a seal around the first and second ends of the sealing collar 112.

Figure 4:
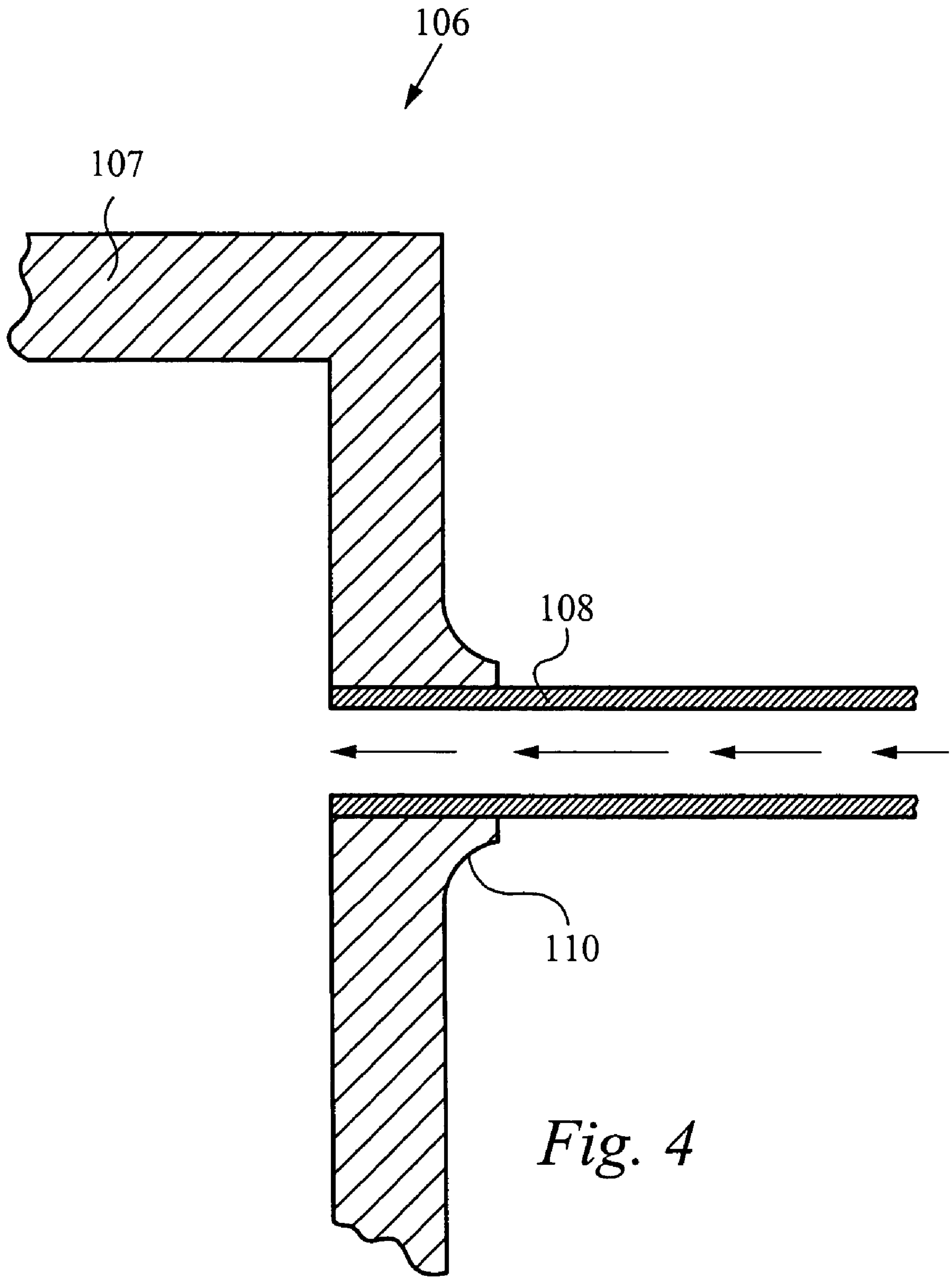
FIG. 4 illustrates a second interconnection between the fluid tube and the component port.

FIG. 4 illustrates a second interconnection between the fluid tube 108 and a component port 110. As shown in FIG. 4, the fluid tube 108 is coupled directly to the inlet port 110. The interconnection between the fluid tube 108 and the inlet port 110 is preferably accomplished by compression fitting, whereby the housing 107 is heated to a sufficiently high temperature to expand the inlet port 110. The fluid tube 108 is then inserted into the expanded inlet port 110 and held in place while the housing 107 cools. As the housing cools, it contracts thermally, and the inlet port 110 also contracts, eventually forming a compression seal around the fluid tube 108. Preferably, the fluid tube 108 is comprised of a sufficiently ductile material such that when the inlet port 110 contracts around the fluid tube 108, the fluid tube 108 does not crack or break. The amount of compression can be controlled to avoid cracking the housing 107 yet still cause some compression of the fluid tube 108.

Figure 5:
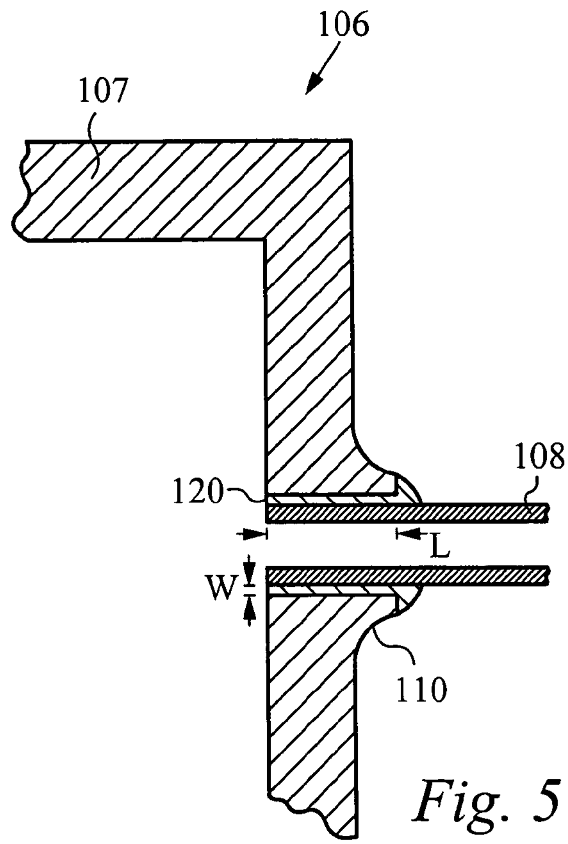
FIG. 5 illustrates a third interconnection between the fluid tube and the component port.

FIG. 5 illustrates a third interconnection between the fluid tube 108 and a component port 110. As shown in FIG. 5, a sealing material 120 is placed between the inner surface of the inlet port 110 and the outer surface of the fluid tube 108. The fluid tube 108 is preferably coupled to the inlet port 110 by compression fitting, as described above in relation to FIG. 4. The permeation rate of the sealing material is proportional to the seal area divided by the seal length. As related to FIG. 5, the seal area is approximately equal to the radius of fluid tube 108 times the width W of the sealing material 120 times 2 times Pi. The seal length is the length L of the sealing material 120.

The sealing material 120 is preferably solder, although sealing glass or epoxy can also be used. Alternatively, any sealing material with a permeability rate that provides a hermetic seal with a diffusion rate within a predetermined range can be used. Solder forms a particular effective hermetic seal. Solder can be applied to metals that have had proper surface treatments, glasses, and ceramics. When solder is applied to glass and ceramic, the glass and ceramic are preferably metalized prior to applying the solder. Solder melting temperatures can be selected over a broad range. A series of different solders with successively lower melting temperatures can also be used to allow a sequential sealing of joints. In addition to providing a hermetic seal, solder is also advantageous because it's ductility allows some mismatch between the thermal expansion coefficients of the housing, solder, and tube materials.

In general, epoxies have marginal or poor permeabilities for vapor diffusion, and are not a preferable choice for a joint material. However, in certain configurations, the area/length ratio of the epoxy can be very low, so that there is very little exposed area and a very long path for diffusion from the inside to the outside of the component. If such a configuration is used, the epoxy permeability is acceptable.

Sealing glasses are also known to have very low permeabilities, and can be used as hermetic sealing compounds in joints between metals and glass. Sealing glass is generally a brittle material, so this kind of arrangement requires that the thermal expansion coefficients of the housing, tube and sealing glass are similar. The sealing glass generally hardens at a relatively high temperature, e.g. greater than 400 degrees Celsius, so the thermal expansion of the housing, tube, and sealing glass are preferably similar over the range of temperatures from the seal temperature to the use temperatures. There are a wide variety of sealing glasses with varying thermal expansion coefficients, and there are wide varieties of metal tube materials which have thermal expansion coefficients over a broad range. Careful selection of the tube material and the seal material can allow use with most glass or ceramic housing materials.

Figure 6:
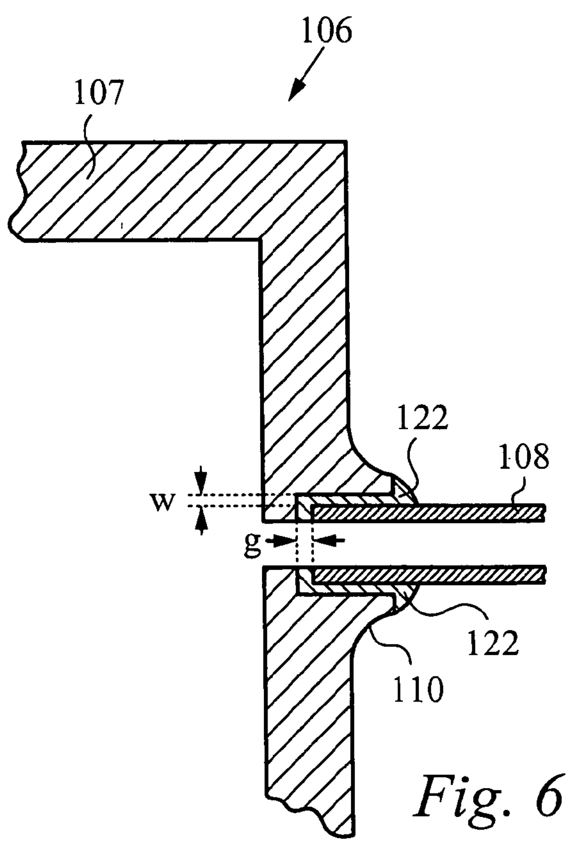
FIG. 6 illustrates a fourth interconnection between the fluid tube and the component port.

FIG. 6 illustrates a fourth interconnection between the fluid tube 108 and a component port 110. In this fourth interconnection, the width of the inlet port 110 is not constant through the entire width of the housing 107. Instead, the width of the inlet port 110 narrows at some point within the housing 107, thereby creating a stop. The fluid tube 108 is inserted into the inlet port 110 to a point that is short of the stop by an end gap distance g. A sealing material 122 forms a seal between the fluid tube 108 and housing 107, where the sealing material 122 also forms a seal of end gap width g between the end of the fluid tube and the stop within the housing 107. Forming the stop and providing the sealing material 122 with a small gap distance g acts to reduce the exposed surface area of the sealing material 122, which reduces diffusion.

A sealing material can also be used in the case where the fluid tube 108 is coupled to the inlet port 110 via the sealing collar 112, as described above in relation to FIG. 3. In this case, the sealing material can be placed between the outer surface of the first end of the sealing collar 112 and the inner surface of the inlet port 110. The sealing material can also be placed between the outer surface of the second end of the sealing collar 112 and the inner surface of the fluid tube 108. It is understood that the sealing material can be used to couple the sealing collar 112 to the inlet port 110, or to couple the sealing collar 112 to the fluid tube 108, or a combination of the two. Further, the housing 107 is preferably comprised of a material with a thermal expansion coefficient sufficiently large such that heating the housing 107 to a relatively high temperature, e.g. 400 degrees Celsius or higher, sufficiently expands the inlet port 110 to allow insertion of the fluid tube 108, the sealing collar 112, and/or the sealing material 120,122.

Figure 7:
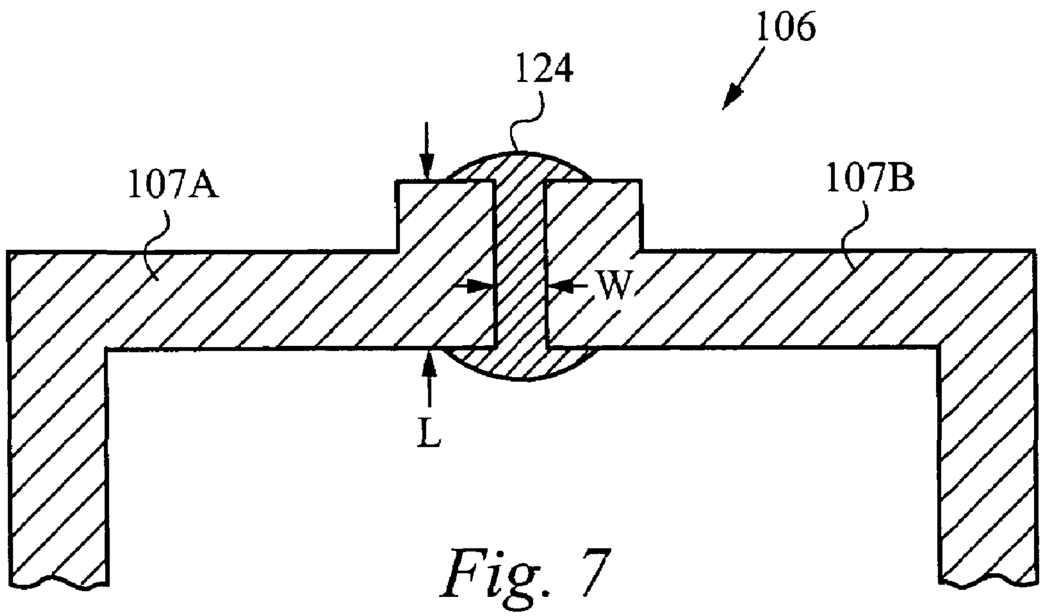
FIG. 7 illustrates a first housing interconnect for the housing of the pump.
Figure 8:
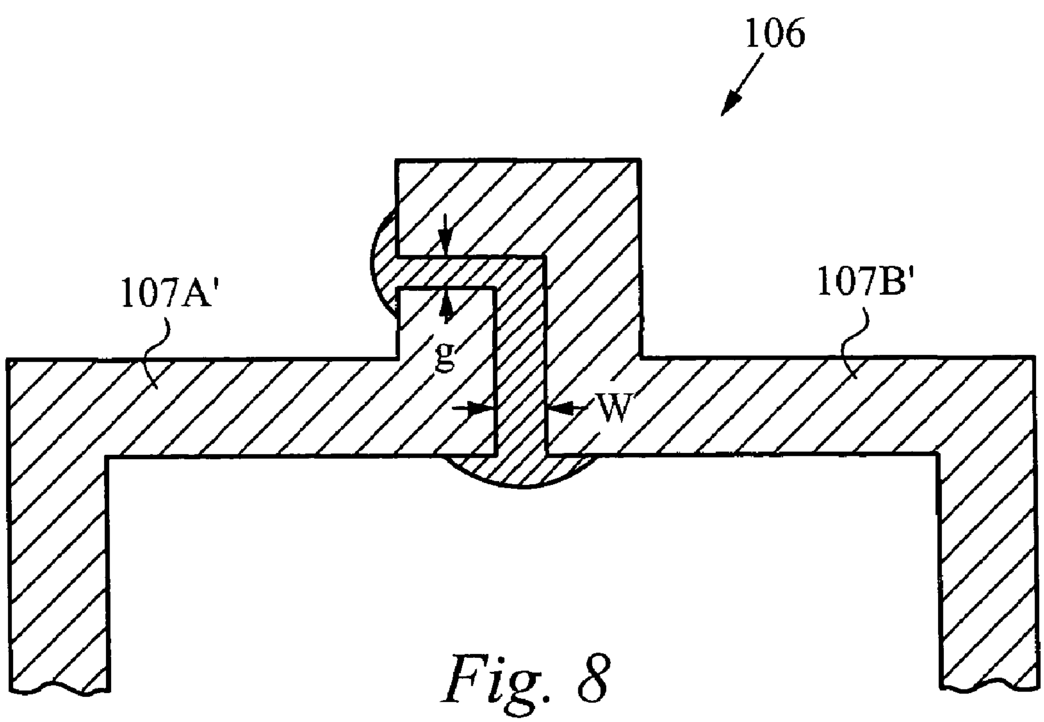
FIG. 8 illustrates a second housing interconnect for the housing of the pump.

Although the first housing interconnection illustrated in FIG. 7 shows each end portion of the left half portion 107A and the right half portion 107B to be mirror images of each other, other end portion configurations are considered. FIG. 8 illustrates a second housing interconnect in which the end portion of the right half portion 107B' bends around a left half portion 107A'. The left half portion 107A' is coupled to the right half portion 107B' by a sealing material 126. The gap g formed where the right half portion 107B' bends around the left half portion 107A' is preferably minimized thereby reducing the exposed surface area of the sealing material 126, which reduces diffusion. The two halves 107A' and 107B' are preferably coupled together using a compression seal. In this case, the right half portion 107B' is pre-heated to expand, the left half portion 107A'with sealing material 126 is then placed in contact with the right half portion 107B', and the right half portion 107B' then contracts and seals upon cooling. The housing 107 can be comprised of more than two separate pieces, which can be sealed together as described above. Each piece of the housing 107 can be similarly configured, as in FIG. 7, uniquely configured, or a combination thereof.

Although the first housing interconnection illustrated in FIG. 7 shows each end portion of the left half portion 107A and the right half portion B to be mirror images of each other, other end portion configurations are considered. FIG.

8 illustrates a second housing interconnect in which the end portion of the right half portion 107B' bends around a left half portion 107A'. The left half portion 107A' is coupled to the right half portion 107B' by a sealing material 126. The gap g formed where the right half portion 107B' bends around the left half portion 107A' is preferably minimized thereby reducing the exposed surface area of the sealing material 126, which reduces diffusion. The two halves 107A' and 107B' are preferably coupled together using a compression seal. In this case, the right half portion 107B' is pre-heated to expand, the left half portion 107A' with sealing material 107 is then placed in contact with the right half portion 107B', and the right half portion 107B' then contracts and seals upon cooling. The housing 107 can be comprised of more than two separate pieces, which can be sealed together as described above. Each piece of the housing 107 can be similarly configured, as in FIG. 7, uniquely configured, or a combination thereof.

As illustrated in FIG. 2–6, the portion of the housing 107 that comprises the inlet port 110 preferably extends beyond the outer surface of the remaining portion of the housing 107. Alternatively, the inlet portion 110 is approximately flush with the housing 107. In this alternative case, the seal length L of the sealing material is smaller than the preferred case where the inlet port 110 extends outward from the remaining portion of the housing 107.

Figure 9:
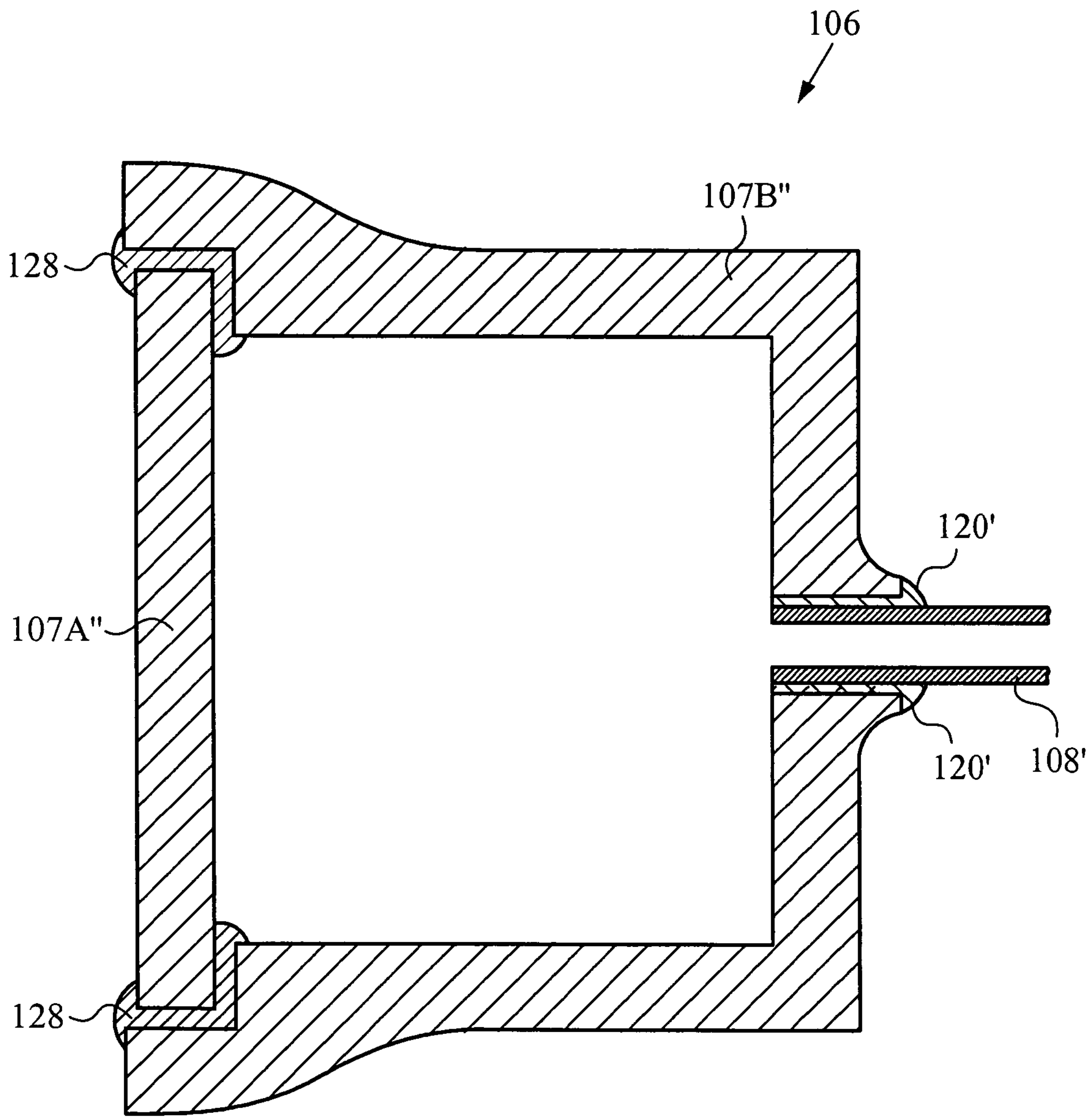
FIG. 9 illustrates a housing and a fluid tube sealed according to a simultaneous multiple compression sealing process.

When sealing multiple pieces of the housing 107, or when sealing the fluid tube 108 or the sealing collar 112 to the housing 107, the sealing process can be comprised of a series of successive seals, or multiple seals can be formed simultaneously. FIG. 9 illustrates an exemplary pump configuration in which a right half portion 107B" and a left half portion 107A" of the housing 107 can be sealed together simultaneously with the sealing of a fluid tube 108' and the right half portion 107B". In this case, the sealing is preferably performed using a compression seal where the right half portion 107B" is pre-heated to expand. The fluid tube 108' and sealing material 120' are then inserted within an opening in the right half portion 107B", and the left half portion 107A" and sealing material 128 are properly aligned with the right half portion 107B". As the right half portion 107B" cools, a compression seal is formed between the fluid tube 108' and the right half portion 107B", and the left half portion 107A" and the right half portion 107B". Preferably, the sealing material 120', 128 is placed on the fluid tube 108 and the left half portion 107A" prior to placing in contact with the right half portion 107B". The sealing material 120', 128 melts and cures when contacted by the heated right half portion 107B".

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, the design configurations of the housing 106, and the housing portions 107A, 107A', 107A", 107B, 107B', and 107B" are for exemplary purposes only and should by no means limit the design configurations contemplated by the present invention. Further, although the techniques for providing a hermetically sealed environment are described above in relation to the pump 106, it is also contemplated that the same, or similar techniques can also be applied to any other components within the closed loop system 100, or to any component within a hermetic system.

What is claimed is:

1. A closed loop fluid pumping system to control a temperature of an electronic device, the system comprising:

a. at least one pump;

b. at least one heat exchanger coupled to the electronic device and configured to pass a fluid therethrough, wherein the fluid performs thermal exchange with the electronic device;

c. at least one heat rejector; and d. fluid interconnect components including fluid lines to couple the at least one pump, the at least one heat exchanger and the at least one heat rejector, wherein the closed loop fluid pumping system loses up to a predetermined maximum amount of the fluid over a desired amount of operating time.

2. The hermetic closed loop fluid system according to claim 1 wherein the fluid is a single phase fluid.

3. The hermetic closed loop fluid system according to claim 1 wherein the fluid is a two phase fluid.

4. The hermetic closed loop fluid system according to claim 1 wherein the at least one pump is made of a material having a desired permeability.

5. The hermetic closed loop fluid system according to claim 4 wherein the at least one pump is made of a metal, a ceramic, a glass, a plastic, a metalized plastic, or any combination thereof.

6. The hermetic closed loop fluid system according to claim 1 wherein the fluid interconnect components are made of a material with a desired permeability.

7. The hermetic closed loop fluid system according to claim 6 wherein the fluid interconnect components are made of a metal, a ceramic, a glass, a plastic, a metalized plastic, or any combination thereof.

8. The hermetic closed loop fluid system according to claim 1 wherein the fluid interconnect components are coupled to the at least one pump, the at least one heat exchanger, and the at least one heat rejector by adhesives, solder, welds, brazes, or any combination thereof.

9. The hermetic closed loop fluid system according to claim 1 wherein the fluid interconnect components include a sealing collar configured to be positioned between the at least one pump, the at least one heat exchanger, or the at least one heat rejector and a fluid tube.

10. The hermetic closed loop fluid system according to claim 9 wherein the sealing collar includes a thermal expansion coefficient substantially similar to a thermal expansion coefficient of the at least one pump, the at least one heat exchanger, or the at least one heat rejector to which the sealing collar is coupled.

11. The hermetic closed loop fluid system according to claim 9 wherein the sealing collar includes a ductility characteristic to provide a sealed junction with the fluid tube.

12. The hermetic closed loop fluid system according to claim 9 wherein the sealing collar is sealably coupled to the at least one pump, the at least one heat exchanger, or the at least one heat rejector and the fluid tube using compression fitting.

13. The hermetic closed loop fluid system according to claim 1 wherein the closed loop fluid pumping system losses less than 0.89 grams of fluid per year.

14. The hermetic closed loop fluid system according to claim 1 wherein the closed loop fluid pumping system losses less than 1.25 grams of fluid per year.

15. The hermetic closed loop fluid system according to claim 1 wherein the closed loop fluid pumping system losses less than 2.5 grams of fluid per year.

16. A closed loop fluid pumping system to control a temperature of an electronic device, the system comprising:

a. at least one pump;

b. at least one heat exchanger coupled to the electronic device and configured to pass a fluid therethrough, wherein the fluid performs thermal exchange with the electronic device;

c. at least one heat rejector; and d. fluid interconnect components including fluid lines to couple the at least one pump, the at least one heat exchanger and the at least one heat rejector, wherein the closed loop fluid pumping system loses less than 0.89 grams of fluid per year.

17. The hermetic closed loop fluid system according to claim 16 wherein the fluid is a single phase fluid.

18. The hermetic closed loop fluid system according to claim 16 wherein the fluid is a two phase fluid.

19. The hermetic closed loop fluid system according to claim 16 wherein the at least one pump is made of a material having a desired permeability.

20. The hermetic closed loop fluid system according to claim 19 wherein the at least one pump is made of a metal, a ceramic, a glass, a plastic, a metalized plastic, or any combination thereof.

21. The hermetic closed loop fluid system according to claim 16 wherein the fluid interconnect components are made of a material with a desired permeability.

22. The hermetic closed loop fluid system according to claim 21 wherein the fluid interconnect components are made of a metal, a ceramic, a glass, a plastic, a metalized plastic, or any combination thereof.

23. The hermetic closed loop fluid system according to claim 16 wherein the fluid interconnect components are coupled to the at least one pump, the at least one heat exchanger, and the at least one heat rejector by adhesives, solder, welds, brazes, or any combination thereof.

24. The hermetic closed loop fluid system according to claim 16 wherein the fluid interconnect components include a sealing collar configured to be positioned between the at least one pump, the at least one heat exchanger, or the at least one heat rejector and a fluid tube.

25. The hermetic closed loop fluid system according to claim 24 wherein the sealing collar includes a thermal expansion coefficient substantially similar to a thermal expansion coefficient of the at least one pump, the at least one heat exchanger, or the at least one heat rejector to which the sealing collar is coupled.

26. The hermetic closed loop fluid system according to claim 24 wherein the sealing collar includes a ductility characteristic to provide a sealed junction with the fluid tube.

27. The hermetic closed loop fluid system according to claim 24 wherein the sealing collar is sealably coupled to the at least one pump, the at least one heat exchanger, or the at least one heat rejector and the fluid tube using compression fitting.

28. A closed loop fluid pumping system to control a temperature of an electronic device, the system comprising:

a. at least one pump;

b. at least one heat exchanger coupled to the electronic device and configured to pass a fluid therethrough, wherein the fluid performs thermal exchange with the electronic device;

c. at least one heat rejector; and d. fluid interconnect components including fluid lines to couple the at least one pump, the at least one heat exchanger and the at least one heat rejector, wherein the closed loop fluid pumping system loses less than 1.25 grams of fluid per year.

29. The hermetic closed loop fluid system according to claim 28 wherein the fluid is a single phase fluid.

30. The hermetic closed loop fluid system according to claim 28 wherein the fluid is a two phase fluid.

31. The hermetic closed loop fluid system according to claim 28 wherein the at least one pump is made of a material having a desired permeability.

32. The hermetic closed loop fluid system according to claim 31 wherein the at least one pump is made of a metal, a ceramic, a glass, a plastic, a metalized plastic, or any combination thereof.

33. The hermetic closed loop fluid system according to claim 28 wherein the fluid interconnect components are made of a material with a desired permeability.

34. The hermetic closed loop fluid system according to claim 33 wherein the fluid interconnect components are made of a metal, a ceramic, a glass, a plastic, a metalized plastic, or any combination thereof.

35. The hermetic closed loop fluid system according to claim 28 wherein the fluid interconnect components are coupled to the at least one pump, the at least one heat exchanger, and the at least one heat rejector by adhesives, solder, welds, brazes, or any combination thereof.

36. The hermetic closed loop fluid system according to claim 28 wherein the fluid interconnect components include a sealing collar configured to be positioned between the at least one pump, the at least one heat exchanger, or the at least one heat rejector and a fluid tube.

37. The hermetic closed loop fluid system according to claim 36 wherein the sealing collar includes a thermal expansion coefficient substantially similar to a thermal expansion coefficient of the at least one pump, the at least one heat exchanger, or the at least one heat rejector to which the sealing collar is coupled.

38. The hermetic closed loop fluid system according to claim 36 wherein the sealing collar includes a ductility characteristic to provide a sealed junction with the fluid tube.

39. The hermetic closed loop fluid system according to claim 36 wherein the sealing collar is sealably coupled to the at least one pump, the at least one heat exchanger, or the at least one heat rejector and the fluid tube using compression fitting.

40. A closed loop fluid pumping system to control a temperature of an electronic device, the system comprising:

a. at least one pump;

b. at least one heat exchanger coupled to the electronic device and configured to pass a fluid therethrough, wherein the fluid performs thermal exchange with the electronic device;

c. at least one heat rejector; and d. fluid interconnect components including fluid lines to couple the at least one pump, the at least one heat exchanger and the at least one heat rejector, wherein the closed loop fluid pumping system loses less than 2.5 grams of fluid per year.

41. The hermetic closed loop fluid system according to claim 40 wherein the fluid is a single phase fluid.

42. The hermetic closed loop fluid system according to claim 40 wherein the fluid is a two phase fluid.

43. The hermetic closed loop fluid system according to claim 40 wherein the at least one pump is made of a material having a desired permeability.

44. The hermetic closed loop fluid system according to claim 43 wherein the at least one pump is made of a metal, a ceramic, a glass, a plastic, a metalized plastic, or any combination thereof.

45. The hermetic closed loop fluid system according to claim 40 wherein the fluid interconnect components are made of a material with a desired permeability.

46. The hermetic closed loop fluid system according to claim 45 wherein the fluid interconnect components are made of a metal, a ceramic, a glass, a plastic, a metalized plastic, or any combination thereof.

47. The hermetic closed loop fluid system according to claim 40 wherein the fluid interconnect components are coupled to the at least one pump, the at least one heat exchanger, and the at least one heat rejector by adhesives, solder, welds, brazes, or any combination thereof.

48. The hermetic closed loop fluid system according to claim 40 wherein the fluid interconnect components include a sealing collar configured to be positioned between the at least one pump, the at least one heat exchanger, or the at least one heat rejector and a fluid tube.

49. The hermetic closed loop fluid system according to claim 48 wherein the sealing collar includes a thermal expansion coefficient substantially similar to a thermal expansion coefficient of the at least one pump, the at least one heat exchanger, or the at least one heat rejector to which the sealing collar is coupled.

50. The hermetic closed loop fluid system according to claim 48 wherein the sealing collar includes a ductility characteristic to provide a sealed junction with the fluid tube.

51. The hermetic closed loop fluid system according to claim 48 wherein the sealing collar is sealably coupled to the at least one pump, the at least one heat exchanger, or the at least one heat rejector and the fluid tube using compression fitting.

52. A method of manufacturing a closed loop fluid pumping system to control the temperature of an electronic device, the method comprising:

a. forming at least one heat exchanger to be configured in contact with the electronic device and to pass a fluid therethrough, wherein the fluid performs thermal exchange with the electronic device;

b. forming at least one pump;

c. forming at least one heat rejector;

d. forming fluid interconnect components including fluid lines; and e. coupling the at least one heat exchanger to the at least one pump and to the at least one heat rejector using the fluid interconnect components, thereby forming the closed loop fluid pumping system, wherein the closed loop fluid pumping system is formed to lose less than a predetermined amount of the fluid over a desired amount of operating time.

53. The method according to claim 52 wherein the fluid is a single phase fluid.

54. The method according to claim 52 wherein the fluid is a two phase fluid.

55. The method according to claim 52 wherein the at least one pump is formed of a material having a desired permeability.

56. The method according to claim 55 wherein the at least one pump is formed of a metal, a ceramic, a glass, a plastic, a metalized plastic, or any combination thereof.

57. The method according to claim 52 wherein the fluid interconnect components are formed of a material having a desired permeability.

58. The method according to claim 57 wherein the fluid interconnect components are made of a metal, a ceramic, a glass, a plastic, a metalized plastic, or any combination thereof.

59. The method according to claim 52 wherein the fluid interconnect components are coupled to the at least one pump, the at least one heat exchanger, and the at least one heat rejector using adhesives, solder, welds, brazes, or any combination thereof.

60. The method according to claim 52 wherein the fluid interconnect components include a sealing collar configured to be positioned between the at least one pump, the at least one heat exchanger, or the at least one heat rejector and a fluid tube.

61. The method according to claim 60 wherein the sealing collar includes a thermal expansion coefficient substantially similar to a thermal expansion coefficient of the at least one pump, the at least one heat exchanger, or the at least one heat rejector to which the sealing collar is coupled.

62. The method according to claim 60 wherein the sealing collar includes a ductility characteristic to provide a sealed junction with the fluid tube.

63. The method according to claim 60 wherein the sealing collar is sealably coupled to the at least one pump, the at least one heat exchanger, or the at least one heat rejector and the fluid tube using compression fitting.

64. The method according to claim 52 wherein the closed loop fluid pumping system losses less than 0.89 grams of fluid per year.

65. The method according to claim 52 wherein the closed loop fluid pumping system losses less than 1.25 grams of fluid per year.

66. The method according to claim 52 wherein the closed loop fluid pumping system losses less than 2.5 grams of fluid per year.

* * * * *

UNITED STATES PATENT AND TRADEMARK OFFICE

CERTIFICATE OF CORRECTION

PATENT NO. : 7,021,369 B2 
APPLICATION NO. : 10/769717
DATED : April 4, 2006
INVENTOR(S) : Douglas Werner, Mark Munch and Thomas Kenny It is certified that error appears in the above-identified patent and that said Letters Patent is hereby corrected as shown below:

IN THE SPECIFICATION - SUMMARY OF THE INVENTION

In column 2, line 34, replace “losses” with --loses--.

In column 3, line 7, replace “losses” with --loses--.

In column 3, line 42, replace “losses” with --loses--.

In column 4, line 10, replace “losses” with --loses--.

IN THE CLAIMS

In column 14, line 63, claim 13, replace “losses” with --loses--.

In column 14, line 66, claim 14, replace “losses” with --loses--.

In column 15, line 2, claim 15, replace “losses” with --loses--.

In column 18, line 44, claim 64, replace “losses” with --loses--.

In column 18, line 47, claim 65, replace “losses” with --loses--.

In column 18, line 50, claim 66, replace “losses” with --loses--.

Signed and Sealed this

Fourth Day of July, 2006

JON W. DUDAS
*Director of the United States Patent and Trademark Office*